United States Patent
Welna et al.

(10) Patent No.: US 9,927,679 B2
(45) Date of Patent: Mar. 27, 2018

(54) WAVELENGTH SEPARATING ELEMENT FOR USE IN A NONLINEAR FREQUENCY CONVERSION DEVICE

(71) Applicant: Sharp Kabushiki Kaisha, Osaka (JP)

(72) Inventors: Karl Peter Welna, Abingdon (GB); Tim Michael Smeeton, Oxford (GB); Valerie Berryman-Bousquet, Chipping Norton (GB)

(73) Assignee: Sharp Kabushiki Kaisha, Osaka (JP)

( * ) Notice: Subject to any disclaimer, the term of this patent is extended or adjusted under 35 U.S.C. 154(b) by 227 days.

(21) Appl. No.: 14/958,029

(22) Filed: Dec. 3, 2015

(65) Prior Publication Data
US 2017/0160622 A1    Jun. 8, 2017

(51) Int. Cl.
*G02F 1/35*    (2006.01)
*G02B 5/20*    (2006.01)
(Continued)

(52) U.S. Cl.
CPC ........... *G02F 1/3501* (2013.01); *G02B 5/208* (2013.01); *G02B 5/26* (2013.01); *G02B 27/141* (2013.01);
(Continued)

(58) Field of Classification Search
CPC .......................... G02B 6/29367; G02F 1/3501
See application file for complete search history.

(56) References Cited

U.S. PATENT DOCUMENTS 6,775,432 B2 *   8/2004   Basu .................. G02B 6/29307
                                                   385/24
7,110,426 B2     9/2006   Rudolph
(Continued)

FOREIGN PATENT DOCUMENTS

JP         8-160479 A     6/1996
JP      2002-76487 A     3/2002
(Continued)

OTHER PUBLICATIONS

Nishimura et al., Japanese Journal of Applied Physics 42, 5079, (2003).
(Continued)

*Primary Examiner* — Rhonda Peace
(74) *Attorney, Agent, or Firm* — Renner, Otto, Boisselle & Sklar, LLP

(57) ABSTRACT

A wavelength separating element is provided for separating a converted beam from a fundamental beam in an NLFC device, wherein the converted beam has a wavelength different from a wavelength of the fundamental beam. The wavelength separating element includes a first mirror surface and a second mirror surface opposite to the first mirror surface. The first and second mirror surfaces may have a high reflectivity of the converted beam relative to a reflectivity of the fundamental beam, and the first and second mirror surfaces are configured such that the fundamental and converted beams undergo multiple reflections between the first mirror surface and the second mirror surface to separate the converted beam from the fundamental beam. The fundamental and converted beams undergo at least three reflections at the first and second mirror surfaces, and/or undergo at least two reflections at one of the first mirror surface or the second mirror surface.

20 Claims, 12 Drawing Sheets

(51) Int. Cl.
  *G02B 5/26* (2006.01)
  *G02B 27/14* (2006.01)
  *G02B 27/30* (2006.01)
  *G02F 1/37* (2006.01)
  *H01S 5/00* (2006.01)

(52) U.S. Cl.
  CPC ........... *G02B 27/145* (2013.01); *G02B 27/30* (2013.01); *G02F 1/37* (2013.01); *H01S 5/0092* (2013.01); *G02F 2001/3503* (2013.01)

(56) References Cited

U.S. PATENT DOCUMENTS

| | | |
|---|---|---|
| 8,559,471 B2 | 10/2013 | Mao |
| 8,743,922 B2 | 6/2014 | Smeeton et al. |
| 8,817,831 B1 | 8/2014 | Terraciano et al. |
| 2002/0118915 A1* | 8/2002 | Sagan ............... G02B 6/29367 385/24 |
| 2003/0021527 A1 | 1/2003 | Mitamura et al. |
| 2003/0099262 A1 | 5/2003 | Masuda |
| 2003/0184871 A1 | 10/2003 | Chang et al. |
| 2006/0251422 A1* | 11/2006 | Liu ..................... G02B 6/4215 398/79 |
| 2015/0177593 A1 | 6/2015 | Smeeton et al. |
| 2017/0160622 A1* | 6/2017 | Welna ................... G02B 5/208 |

FOREIGN PATENT DOCUMENTS

| | | |
|---|---|---|
| JP | 2002-228832 A | 8/2002 |
| JP | 2005-208472 A | 8/2005 |
| JP | 2005-266263 A | 9/2005 |

OTHER PUBLICATIONS

Tangtronbenchasil et al., Japanese Journal of Applied Physics 45, 6315, (2006).
Ruhnke et al., Optics Letters 40, 2127, (2015).
Tangtrongbenchasil et al., Japanese Journal of Applied Physics 47, 2137, (2008).

* cited by examiner

WAVELENGTH SEPARATING ELEMENT FOR USE IN A NONLINEAR FREQUENCY CONVERSION DEVICE

TECHNICAL FIELD

This invention relates to a wavelength separating element for exemplary use with frequency-doubled lasers.

BACKGROUND ART

Nonlinear Frequency Conversion (NLFC) is a widely used optical technique for generating specific wavelengths using laser devices. In a NLFC device a light beam, with a fundamental wavelength, enters a NLFC component which converts some of the light with the fundamental wavelength into light with another wavelength. The most common variation of this technique uses a light beam with fundamental wavelength that is frequency-doubled resulting in a converted beam with half the fundamental wavelength, a process known as second harmonic generation (SHG). The NLFC process does not convert all photons of the fundamental beam, however, leading to a spatial overlap of the converted beam with the fundamental beam exiting the NLFC component.

Many applications require only the converted beam so that the fundamental beam exiting the component must be removed. In the specific wavelength range of ultra-violet (UV) radiation between 200 nm and 270 nm, there are different methods found in the prior art to remove the fundamental beam in NLFC devices by placing an element at some point in the beam path after the NLFC component.

An interference filter with a multilayer coating which has high reflectivity for the fundamental beam and transmits a fraction of the converted beam is disclosed in U.S. Pat. No. 7,110,426, Rudolph [issued Sep. 19, 2006, U.S. Army Research Contract W911NF-09-1-0102], and Nishimura et al. [Japanese Journal of Applied Physics 42, 5079, (2003)]. The filter must be made of a UV transparent material such as UV fused silica which is expensive. Furthermore, the performance of those interference filters is not very high for UV wavelengths. In particular, the transmission efficiency of the filters can be as low as 90% (where the transmission efficiency of the filter is defined as the ratio of the power of the converted beam which is transmitted through the filter divided by the power of the converted beam incident on the filter) so there is a disadvantageous loss of output power of the converted beam. In addition, the rejection ratio of the filters can be low (where the rejection ratio is defined as the ratio of the power of the fundamental beam which is incident on the filter divided by the power of the fundamental beam which is transmitted through the filter), so an additional beam separating element can also be needed to further reduce the power of the fundamental beam.

Prisms are used to separate the beams in Tangtronbenchasil et al. [Japanese Journal of Applied Physics 45, 6315, (2006)], and Ruhnke et al. [Optics Letters 40, 2127, (2015)]. The use of a prism makes the laser devices bulky and heavy because a long beam path through the prism is required to ensure good separation between the fundamental and converted beams. The requirement of UV transmittance makes the prism expensive and not suitable for low cost devices.

Frequency-doubling devices can be categorised depending on the polarisation properties of the fundamental and converted beam. In "type I" devices the linearly polarised converted beam exiting the component has an orthogonal polarisation to the linearly polarised fundamental beam. The 90° change in polarisation can be exploited to separate the fundamental and converted beams by using Brewster mirror reflection as in U.S. Pat. No. 8,559,471 (Mao, issued Oct. 15, 2013). A mirror which has high reflectivity to the converted beam and transmits the majority of the fundamental beam is oriented at Brewster angle in a device described by Tangtrongbenchasil et al. [Japanese Journal of Applied Physics 47, 2137, (2008)]. Other features for frequency-doubled lasers capable of emitting deep ultraviolet light are disclosed in U.S. Pat. No. 8,743,922B2 (Smeeton et al., issued Jan. 3, 2014) and U.S. Pat. Pub. No. 2015/0177593A1 (Smeeton et al., published Jun. 25, 2015).

SUMMARY OF INVENTION

This invention provides a wavelength separating element for exemplary use in a non-linear frequency conversion (NLFC) device. Unlike technologies in the prior art, this invention meets the requirements for a low cost, compact element providing high performance wavelength separation; specifically a high transmission efficiency of a converted beam and/or high rejection ratio of a fundamental beam.

In a NLFC device, a fundamental beam emitted by a light source propagates through a NLFC component and is partially converted by a NLFC process into a converted beam with a wavelength different from that of the fundamental beam. The converted beam and the fundamental beam exiting the NLFC component may be close to one another or partially or fully spatially overlapping, resulting in poor beam purity of the converted beam, which is unacceptable for most applications. This invention provides means for reducing the power of the fundamental beam, resulting in a more pure converted beam.

In an aspect of the invention the wavelength separating element in a compact format is achieved including a total of at least three reflections of the fundamental and converted beams at two or more mirror surfaces which are configured such that the reflectivity at the mirror surfaces is high for the converted beam, and the reflectivity at the mirror surfaces is low for the fundamental beam. At least two of the reflections may be from the same mirror surface, and there may be only two mirror surfaces in total which are configured to be approximately parallel to one another. The reflectivity of the mirror surfaces may be configured through the use of multilayer coatings. The mixed beam, consisting of the fundamental and the converted beams, may be incident on the wavelength separating element such that the incidence of the fundamental beam at the first mirror surface is close to the Brewster angle of incidence and the fundamental beam has dominant p-type polarisation. The wavelength separating element provides high performance even when the fundamental beam incident on the wavelength separating element is divergent and has imperfect linear polarisation. This invention allows this high performance wavelength separation in a compact format.

In another aspect of the invention, which provides an output converted beam with high beam quality, a collimating optic which acts on the converted beam has a relatively long focal length, and/or is located a relatively long distance from the NLFC component (distance measured along the optical beam path). Therefore, a wavelength separating element may be disposed on the beam path between the NLFC component and a collimating optic which acts on the converted beam, such that the fundamental beam incident on the wavelength separating element is diverging (not collimated). In combination with other aspects of the invention, this provides a high performance wavelength separating element, and a good beam quality of converted beam within a compact NLFC device. This aspect is particularly advantageous to enable compact NLFC devices which include NLFC components in which the converted beam undergoes birefringent walkoff.

In another aspect of the invention, suitable design rules and dimensions for the optical elements in wavelength separating element are disclosed.

In another aspect of the invention the wavelength separating element is configured for effective disposal of light from the fundamental beam which is transmitted through mirror surfaces in the wavelength separating element. This aspect further improves the purity of the output converted beam. Disposal of the light through use of textured surfaces and/or absorbing materials within the wavelength separating element may significantly reduce light from the fundamental beam spatially overlapping with the output converted beam. This aspect provides a wavelength separating element with high performance in a very small size, thereby enabling compact NLFC devices.

In another aspect of the invention the individual elements of the wavelength separating element may be mounted into a holder fixing their relative position. It is advantageous to use the holder containing the separating element because this allows for some compensation of misalignments of the NLFC device. The mixed beam exiting the crystal may exhibit directional tolerances so that during the assembly step of integrating the holder onto the overall device base, those misalignments can be compensated by readjusting the position of the holder.

The aspects of this invention enable:
efficient beam separation, due to the use of multiple reflections off surfaces and a fundamental beam removal method;
high transmission efficiency of the converted beam through the wavelength separating element (e.g. >95%);
low cost design, due to the use of multiple reflections off a single surface and the potential to use inexpensive materials;
compact format due to the use of a geometry while maintaining low contribution of light from the fundamental beam in the output converted beam; and
an output converted beam with high beam quality.

The invention is particularly advantageous to enable compact NLFC devices which generate deep ultraviolet light (wavelength between 200 nm and 270 nm) by SHG using a laser light source (i.e. laser diode) to generate the fundamental beam. There is a need for a wavelength separating element with these properties because the demand for sources in the deep ultra-violet spectral region is increasing. Separation of the fundamental and converted beams is important to the functionality of these devices.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, like references indicate like parts or features.

DESCRIPTION OF REFERENCE NUMERALS

Figure 1:
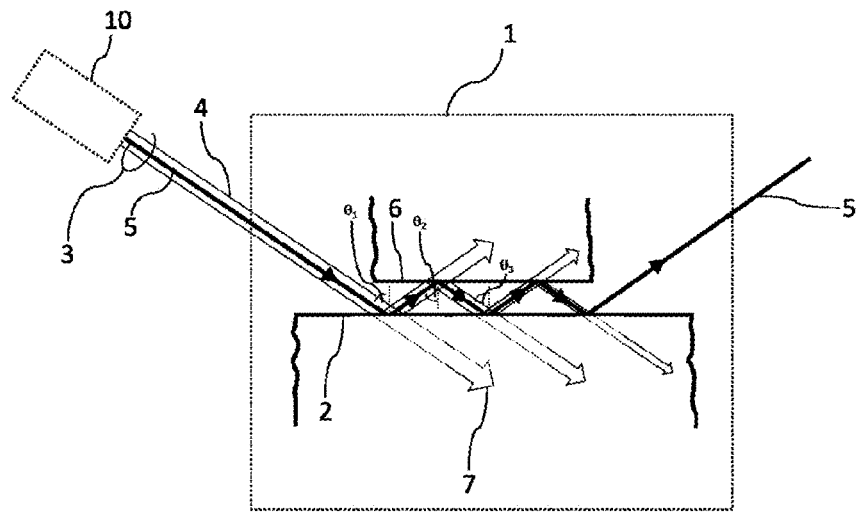
FIG. 1 shows the mixed beam entering the wavelength separating element including two mirror surfaces.

1. Wavelength separating element
2. First mirror surface
3. Mixed beam
4. Fundamental beam
5. Converted beam
6. Second mirror surface
7. Transmitted beam
10. NLFC Generator
11. NFLC Component
12. Inner ray
13. Outer ray
14. Collimating optic
15. Effective source
20. Non-primary beam
21. Thin plate
22. Second surface of thin plate
23. Predefined feature
24. Base
25. Holder
26. Aperture
27. Long side
30. Absorbing layer
31. Laser diode
32. Collimating optic
33. Optical System
34. Filter element
35. Resonator with gain medium
40. NLFC device
41. Internal element
42. Side surface of internal element
43. Absorbing element
44. Second section
45. First section

DETAILED DESCRIPTION OF INVENTION

The invention provides a high performance wavelength separating element which is suitable for low cost and compact NLFC laser. This invention is particularly suited for use with type I frequency doubling where the wavelength of the converted emission is lower than 270 nm.

A high performance wavelength separating element provides either, or preferably both, a high transmission efficiency of the converted beam and a high rejection ratio of the fundamental beam, where the fundamental beam and converted beam are output from a NLFC component.

Generally, the present invention pertains to a wavelength separating element is provided for separating a converted (second) beam from a fundamental (first) beam in an NLFC device, wherein the converted (second) beam has a wavelength different from a wavelength of the fundamental (first) beam. In exemplary embodiments, the wavelength separating element includes at least a first mirror surface and a second mirror surface opposite to the first mirror surface. The first and second mirror surfaces have a high reflectivity of the converted (second) beam relative to a reflectivity of the fundamental (first) beam, and the first and second mirror surfaces are configured such that the fundamental (first) and converted (second) beams undergo multiple reflections between the first mirror surface and the second mirror surface to separate the converted beam from the fundamental beam.

In a first aspect of the invention the high performance wavelength separating element in a compact format is achieved including a total of at least three reflections of the fundamental and converted beams at two or more mirror surfaces, wherein the reflectivity at the mirror surfaces is high for the converted beam and the reflectivity at the mirror surfaces is low for the fundamental beam. Preferably there are at least two reflections from at least one of the mirror surfaces. Preferably there are only two mirror surfaces in total and these two mirror surfaces are approximately parallel to one another. Preferably the fundamental beam is incident on the first mirror surface with dominant polarisation which is p-type, and the angle of incidence of the fundamental beam at the first mirror surface is approximately equal to the Brewster angle for the fundamental beam. Preferably the converted beam is incident on the first mirror surfaces with dominant polarisation which is s-type.

The first aspect of the invention is illustrated in FIG. 1. The wavelength separation element 1 includes a first mirror surface 2 and a second mirror surface 6 opposite to the first mirror surfaces. By referring to the first and second mirror surfaces being opposite to each other, it is meant that the mirror surfaces generally face each other so as to permit reflections between the mirror surfaces. An input beam from a NLFC generator 10 includes a mixed beam 3 of a spatially overlapping first beam that is fundamental beam 4, and a second beam that is converted beam 5. The NLFC generator is a subsystem of a NLFC device including at least one or more light sources, optionally one or more optical elements, and one of more NLFC components. The mixed beam 3 is incident on the first mirror surface 2 at an angle of incidence $\theta_1$. The first mirror surface 2 is configured to have a high reflectivity for the second or converted beam and a low reflectivity for the first or fundamental beam for the angle of incidence $\theta_1$. After reflection at the first mirror surface, the reflected converted beam and the reflected fundamental beam propagate towards, and are incident on, the second mirror surface 6 with angle of incidence $\theta_2$. The second mirror surface 6 is configured to have a high reflectivity for the converted beam and a low reflectivity for the fundamental beam for the angle of incidence $\theta_2$. After reflection from the second mirror surface, the reflected converted beam and the reflected fundamental beam propagate towards and are incident on the first mirror surface 2 with angle of incidence $\theta_3$. The propagation and reflection may continue between the first and second mirror surfaces multiple times: for the example illustrated in FIG. 1, the fundamental beam and converted beam are incident and reflected at the first mirror surface 2 a total of three times, and the beams are incident and reflected at the second mirror surface 6 a total of two times, but the mirror surfaces may be configured for any suitable number of incidents and reflections.

The cumulative effect of multiple reflections of the fundamental beam at the first and optionally second mirror surfaces results in a wavelength separation element with high rejection ratio of the fundamental beam; and the cumulative effect of multiple reflections of the converted beam at the first and optionally second mirror surfaces results in a high transmission efficiency of the converted beam. In the specific example that the reflectivity of the converted beam at the first and second mirror surfaces is approximately the same ($R_c$), and the reflectivity of the fundamental beam at the first and second mirror surfaces is approximately the same ($R_f$), the transmission efficiency $\eta_c$ of the converted beam and the rejection ratio $A_f$ of the fundamental beam are:

$$\eta_c = \frac{P'_c}{P_c} = R_c^n \text{ and } A_f = \frac{P_f}{P'_f} = \frac{1}{R_f^n} \quad (1)$$

with n being the total number of reflections at mirror surfaces, $P'_c$ and $P_c$, being the optical powers of the converted beam at the output and input, respectively, and $P'_f$ and $P_f$, being the optical powers of the fundamental beam at the output and input, respectively.

The use of at least two mirror surfaces oriented approximately parallel to one another wherein the fundamental and converted beam reflect at least twice from at least one of the mirror surfaces provides a high performance wavelength separating element, in a low cost and compact format.

The first and second mirror surfaces may include multi-layer coatings of different materials disposed on a substrate, for example a distributed Bragg reflector (DBR) layer structure disposed on a substrate. The reflectivity of the first and second mirror surfaces to the fundamental and converted beams may be the same, but are not necessarily so.

Figure 2:
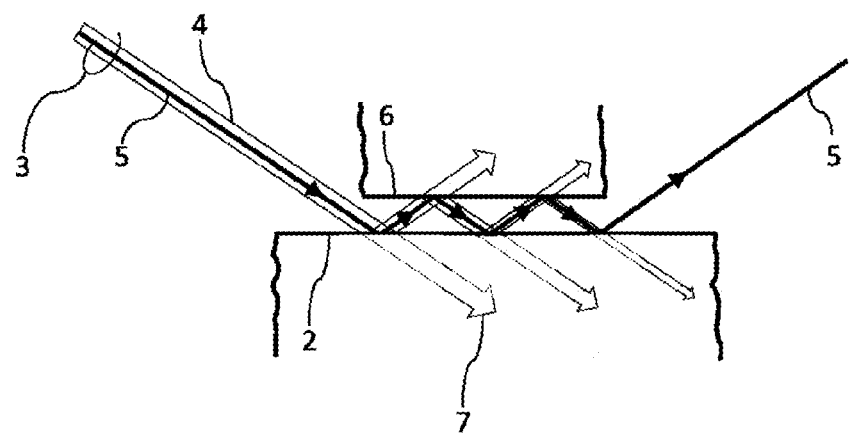
FIG. 2 shows a wavelength separating element including two mirror surfaces.
Figure 3:
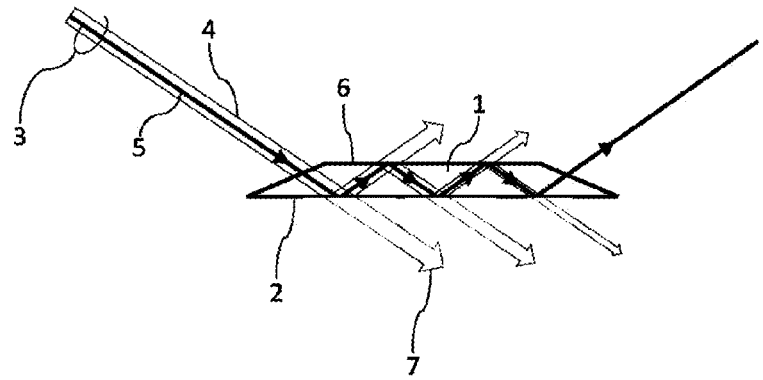
FIG. 3 shows a wavelength separating element including a single element.

Two general structures for providing the mirror surfaces will now be described. In the first general type of structure, the first and second mirror surfaces may be disposed on the surface of one or more separate elements spaced apart such that the fundamental and converted beams propagate through a spatial gap (e.g. air, another gas or vacuum) in between reflections at the mirror surfaces. Exemplary configurations of this first general type of structure are illustrated in FIG. 2. In a second general type of structure, the mirror surfaces may be disposed on surfaces of a single element such that the fundamental and converted beams propagate through the internal volume of said element in between reflections at the mirror surfaces. Exemplary configurations of the second general type of structure are illustrated in FIG. 3.

The fundamental beam which is not reflected at each of the first and second mirror surfaces may be transmitted through the mirror surfaces. Examples of transmitted beams 7 are included in FIGS. 1, 2 and 3 (note that not all of the transmitted beams have been labelled). If there is a difference in refractive index to either the fundamental or converted beams between the media on either side of each of the mirror surfaces 2 and 7, the direction of the transmitted beams will change due to refraction; this change in beam direction is not shown the figures.

To obtain low reflectivity to the fundamental beam with p-type polarisation at the mirror surfaces 2, 6 ($R_f$), it is advantageous to use an angle of incidence approximately equal to the Brewster angle. The Brewster angle may be determined from:

$$\tan\theta_{Br} = \frac{n_{trans}}{n_{prop}} \quad (2)$$

where $\theta_{Br}$ is the Brewster angle, $n_{prop}$ is the refractive index for the fundamental beam in the medium before the fundamental beam is incident on the mirror surface, and $n_{trans}$ is the refractive index for the fundamental beam in the medium after the fundamental beam has propagated through the mirror surface. If the mixed beam is initially propagating in air or a gas then $n_{prop} \approx 1.0$.

In principle, when the Brewster angle condition is satisfied, the reflectivity of a p-polarised beam becomes approximately zero ($R_f \approx 0$). Therefore, reflection from one or two mirror surfaces would be expected to provide a very high rejection ratio and therefore be sufficient to provide output of the converted beam from a NLFC device without any significant contribution from the fundamental beam (see Equation 1).

However, the inventors have found that a simple filter using only one or two mirror surfaces may be inadequate, especially for NLFC devices configured to generate UV light with wavelength less than 270 nm using one or more laser diodes as the source of the fundamental beam. In particular the inventors have identified a significant advantage to use of reflections from more than two mirror surfaces, and the configuration described above including at least two mirror surfaces and preferably at least two reflections from at least one of the mirrors, owing to specific characteristics of the mixed beams in said laser devices, which are now identified and explained.

A first characteristic of the mixed beam in these devices is the imperfect polarisation of the fundamental beam. Although the dominant polarisation of the fundamental beam is p-type at the reflection with the first mirror surface, the contribution of s-type polarised light has been found to be unexpectedly high, due to at least one of the imperfect linear polarisation in the emission from laser diodes and partial rotation of the net linear polarisation of the fundamental beam within NLFC components (e.g. due to the effect of birefringence in birefringent NLFC components such as ($\beta$-BaB$_2$O$_4$ components). Although reflection of p-type polarised light in the fundamental beam from the mirror surfaces may be very low (less than 1%, and usually less than 0.1% or 0.01%), reflection of s-type polarised light in the fundamental beam is typically much higher (e.g. more than 1%, and usually more than 10%). This is especially the case for mirrors which can be produced using existing technology which provide high reflectivity at deep UV wavelengths, as required for a NLFC component with a generated beam with wavelength shorter than 270 nm.

A consequence of the much higher reflectivity for fundamental beam with s-type polarisation is that the rejection ratio for the fundamental beam is reduced. It is necessary to consider the reflectivity of the first and second mirror surfaces to s-type and p-type polarised light separately: $R_{f,s}$ and $R_{f,p}$, respectively. The ratio of the power of s-type polarised light divided by the total power of the fundamental beam will increase after reflection at the mirror surfaces. The rejection ratio is then defined as:

$$A_f = \frac{P_f}{P'_f} = \frac{1}{(\varepsilon R_{f,s}^n + R_{f,p}^n - \varepsilon R_{f,p}^n)} \quad (3)$$

where $\varepsilon$ is the s-polarisation ratio $$\left(\varepsilon = \frac{P_{f,s}}{P_f}\right),$$

and where $P_{f,s}$ is the optical power of s-type polarisation in the fundamental beam incident on the first mirror surface.

For example, with $R_{f,s}=0.1$ and $R_{f,p}=0.01$ and $\varepsilon=0.05$ the rejection ratio is only $A_f=1.7\times10^3$ for n=2 reflections (inadequate owing to the generally low conversion efficiency of NLFC devices, especially for conversion of light from laser diodes converted to wavelengths less than 270 nm by SHG), but is $A_f$ 32 $2\times10^4$ for n=3 reflections and is $A_f=2\times10^6$ for n=5 reflections (suitable for NLFC devices, including those using conversion of light from laser diodes to converted light with wavelengths less than 270 nm by SHG). As comparative examples, in the expected case that the fundamental light has a high degree of linear polarisation ($\epsilon<0.001$), the rejection ratios are $A_f=9.1\times10^3$ for n=2, $A_f=5\times10^5$ for n=3 and $A_f=1\times10^8$ for n=5.

As a consequence, it is strongly advantageous to include three or more reflections from the mirror surfaces to provide a sufficiently high rejection ratio for the fundamental beam. A configuration according to the current aspect enables effective filtering of both the p-type and s-type components in an extremely compact device, while retaining high transmission efficiency of the converted beam.

This situation is significantly different from the case for common frequency-quadrupled lasers for generation of light with wavelength 266 nm. In these lasers, which are commonly known in the prior art, the 266 nm wavelength light is generated by frequency-doubling of light with 532 nm wavelength (which is equivalent to the fundamental beam as described herein). In turn, the 532 nm wavelength is generated by another frequency-doubling process of 1064 nm wavelength light. In turn, the 1064 nm light is generated by lasing in a solid state laser component, typically Nd:YAG. Owing to this sequence of frequency-doubling stages, the light with wavelength 532 nm has a very high polarisation ratio. Therefore, for these common systems the simple polarisation-based Brewster filter (for example using one or two Brewster mirrors) is highly effective, in contrast to the current case of the NLFC device using direct frequency-doubling of the light emitted by a laser diode.

Figure 4:
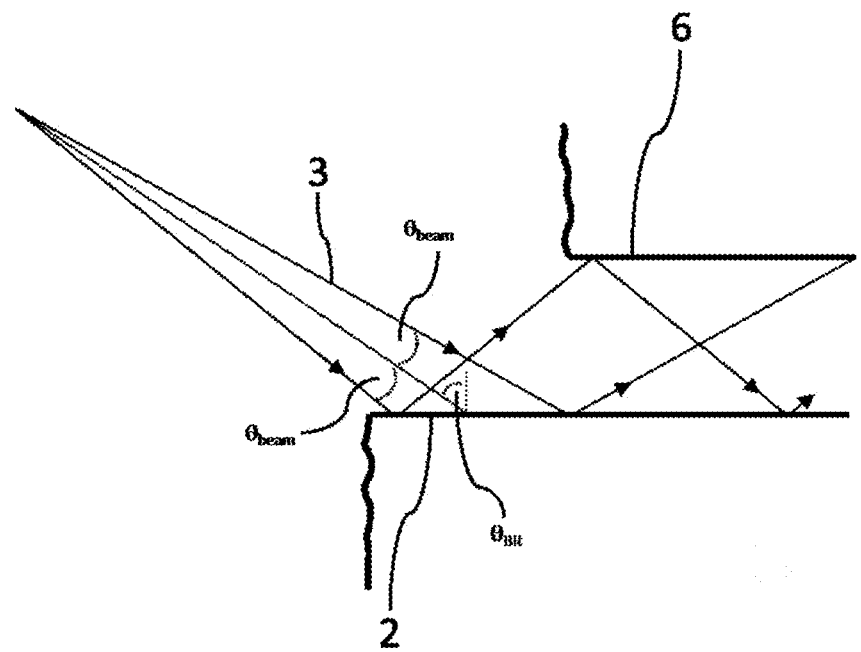
FIG. 4 shows a diverging mixed beam being reflected off the first mirror surfaces.
Figure 5:
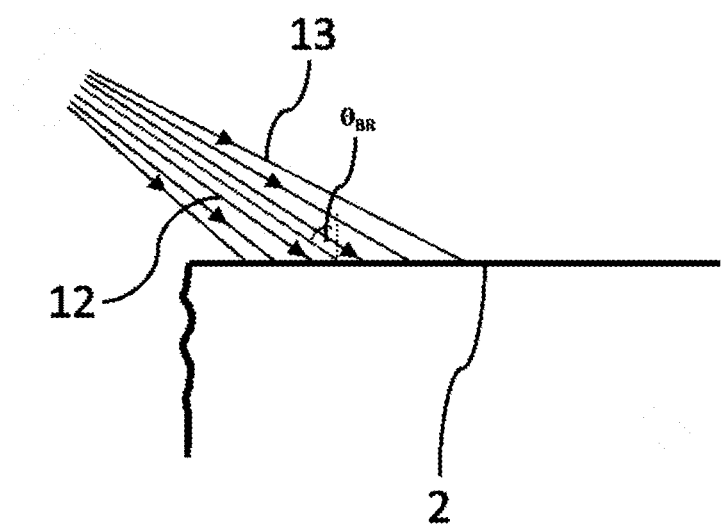
FIG. 5 shows individual ray of beams being incident at the first mirror surface with the central ray being incident at Brewster angle.

A second characteristic of the mixed beam in NLFC devices is that the mixed beam may be strongly diverging, owing to specific details of the NLFC element in the device, especially if the NLFC device is configured to be compact. The importance of this characteristic on the design of the wavelength separating element will now be identified and explained. The Brewster angle condition is only valid for a perfectly collimated beam (i.e. a parallel beam, rather than a diverging beam). In practice, the fundamental beam propagating out from a NLFC component may be diverging, for example if the pump beam for the NLFC is focussed to a waist within the NLFC component. If, when incident on the first mirror surface, the fundamental beam is diverging at a half-angle $\theta_{Beam}$ (FIG. 4), a range of angles will be incident at the first mirror surface as illustrated schematically in FIG. 5. The inner ray beam directions 12 that are closer to the Brewster angle $\theta_{Br}$ have a lower reflectivity than the outer ray beam directions 13 in the outer area. The overall reflectivity to fundamental beam at the mirror surfaces ($R_{fp}$) is increased.

Figure 6:
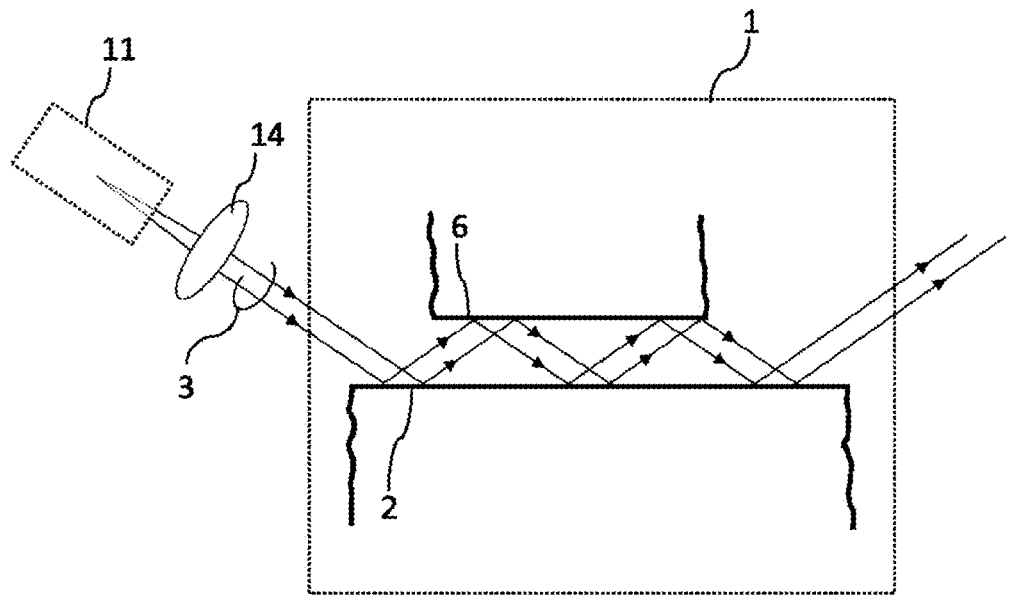
FIG. 6 shows an optic being used between the NLFC component and the wavelength separating element in order to collimate the fundamental beam.

Referring to FIG. 6, one or more collimating optics 14 may be disposed in the propagation path of the mixed beam 3 between the NLFC component 11 and the first mirror surface 2 to reduce this angular spread (improving the collimation) of the fundamental beam. The improved collimation is shown in FIG. 6. This process could commonly be described as "collimating" the fundamental beam, and the one or more optical components are referred to as a "collimating optic" 14, even though the fundamental beam may not be perfectly collimated into a parallel beam with perfectly zero divergence angle by the optic.

In a simple example for a collimating optic, a collimating optic is one or more optical components with effective focal length f, located a distance approximately equal to f from the centre of the NLFC component, where said distance is measured along the beam propagation path of the mixed beam. For example, the optical component with effective focal length f may be a lens or a concave mirror.

When a collimating optic is disposed in the beam path between the NLFC component and the first mirror surface, the effect of the deviation of beam directions in the fundamental beam from the Brewster angle of incidence may be reduced, thereby providing extremely low reflectivity of most or all of the fundamental beam at the mirror surfaces in a wavelength separating element according to the present invention. However, the inventors have determined that there is a significant advantage obtained from not using one or more collimating optics to collimate the fundamental beam before it is incident on the first mirror surface.

In particular, the inventors have found that it is advantageous for a collimating optic which acts on the mixed beam or the converted beam to be located a relatively long distance from the NLFC component, where said distance is measured along the propagation path of the mixed beam. In particular, it is advantageous if a collimating optic is located at least a distance of 15 mm, preferably a distance of at least 25 mm, and most preferably a distance of at least 30 mm from the NLFC component, where said distance is measured along the propagation path of the mixed beam. If the collimating optic for the fundamental beam is located closer to the NLFC component than these values, the inventors have determined that the effect of the collimating optic on the converted beam results in a poor beam quality of the converted beam, which is a significant disadvantage for the use of the converted beam in practical applications. Beam quality is a description of the deviation of a beam from an ideal "Gaussian" beam. A beam with poor beam quality cannot be focussed to a small spot.

For example, this is the case for a NLFC component including $\beta$-BaB$_2$O$_4$, which is suitable to generate deep UV light (wavelength less than 270 nm) by SHG. Based on extensive experiments, the inventors determined that to obtain a high quality UV beam for a NLFC component with length (L, measured along the propagation direction of the fundamental beam) approximately equal to 7 mm, it is necessary to use a collimating optic with focal length of at least 15 mm, preferably at least 25 mm, and most preferably at least 30 mm, wherein the collimating optic is a distance (k) from the centre of the NLFC component, measured along the propagation direction of the converted beam, approximately equal to the focal length of the collimating optic (0.5f<k<2f). In more general case of NLFC components with different length, the focal length should be f>L/0.5, and more preferably f>L/0.3. Typically L is in the range 2 mm-15 mm, and preferably in the range 5 mm-10 mm. Preferably the focal length of the collimating optic is less than 100 mm, and most preferably less than 60 mm to provide a compact device.

Figure 7:
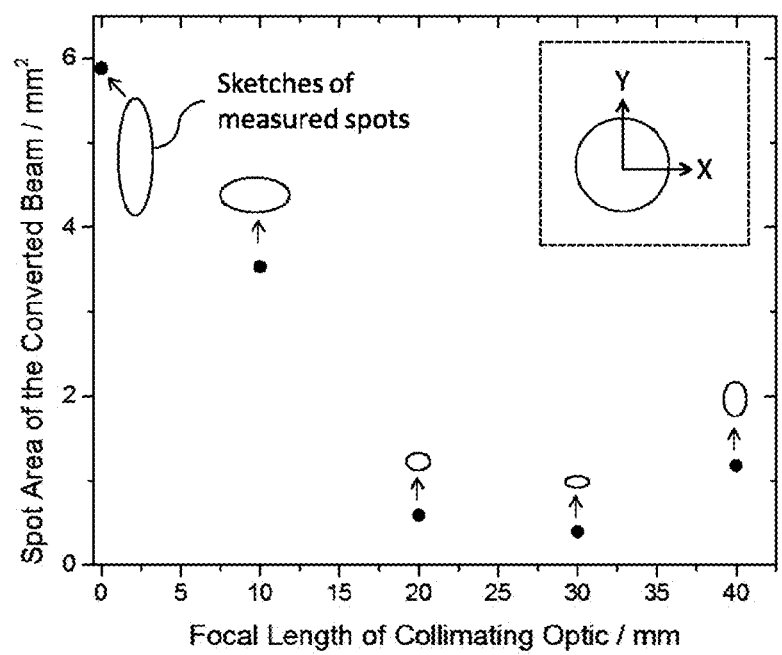
FIG. 7 shows experimental data of the converted beam spot area using different collimating optics.

In most applications where a compact NLFC device is used it is preferable that the converted beam has a beam quality high enough that it can be collimated or focused to a small spot size. According to the findings of the inventors, to obtain high beam quality there is a lower limit for the focal length of any optic acting on the converted beam exiting the NLFC component for certain types of NLFC generators such as ones using $\beta$-BaB$_2$O$_4$ as a NFLC component. It is found, and reported here for the first time, that to provide a converted beam which can be focussed to a small spot, any optic which acts on the converted beam exiting the NLFC component should have a relatively long focal length (i.e. in the ranges defined above). Experimental data are shown in FIG. 7. A NLFC generator configured to output a converted beam with wavelength approximately 224 nm included a laser diode emitting a fundamental light beam with wavelength approximately 448 nm, an aspheric lens and two cylindrical lenses configured according to US Pat Application US20150177593A1 to provide a fundamental beam converging towards a NLFC component, and a NLFC component included a 7 mm long β-BaB$_2$O$_4$ crystal. The converted beam from said NFLC generator, was incident on an optional plano-convex fused silica lens. The fused silica lens was disposed along the direction of propagation of the converted beam at a position which provided the smallest spot area of the converted beam measured at a 7.5 cm distance from the centre for the NLFC component. The plot in FIG. 7 shows the dependence of the area of the converted beam, measured at the 7.5 cm distance, on the focal length of the plano-convex fused silica lens. FIG. 7 also shows the corresponding spot shape with the directions X and Y (see inset) corresponding to the directions shown in FIG. 8. In the case without a plano-convex fused silica lens the spot area is large with area approximately 6 mm$^2$ (plotted as focal length is equal to zero in FIG. 7). A lens with a focal length of approximately 10 mm reduces the spot area, however the lens unexpectedly causes a deterioration in beam quality of the converted beam and the spot remains relatively large. Use of a lens with focal length larger than 15 mm provides an advantageously smaller spot area. This experimental data shows that, against general expectations, a short focal length lens does not result in the smallest spot size, but there is an optimal focal length as shown in the previous section. These findings have implications for the dimensions and positioning of the wavelength separating element as for a compact NFLC device it is preferred that the wavelength separating element is placed between the NLFC component and the collimating optic.

In an aspect of the invention, therefore, to provide an output converted beam with good beam quality, the effective focal length of a collimating optic 14 acting on the converted beam (and optionally also on the fundamental beam) has a focal length greater than, and is located an approximate distance from the centre of the NLFC component (measured along the propagation direction of the converted beam) of at least: 15 mm; preferably 25 mm; most preferably at least 30 mm; L/0.5; preferably L/0.3. Further, to enable a compact device, the effective focal length of a collimating optic may be less than 100 mm, and preferably less than 50 mm.

It is known in the prior art that converted beams generated by SHG from NLFC components which exhibit birefringent walkoff may have poor beam quality. In NLFC components which exhibit birefringence, converted light may undergo a phenomenon known as "walkoff", where the converted light propagates along a direction different to the direction of the fundamental light, typically characterised by an angle, ρ (the walkoff angle), between the direction of converted light and fundamental light. This is known in the prior art to cause imperfect beam quality.

Figure 8:
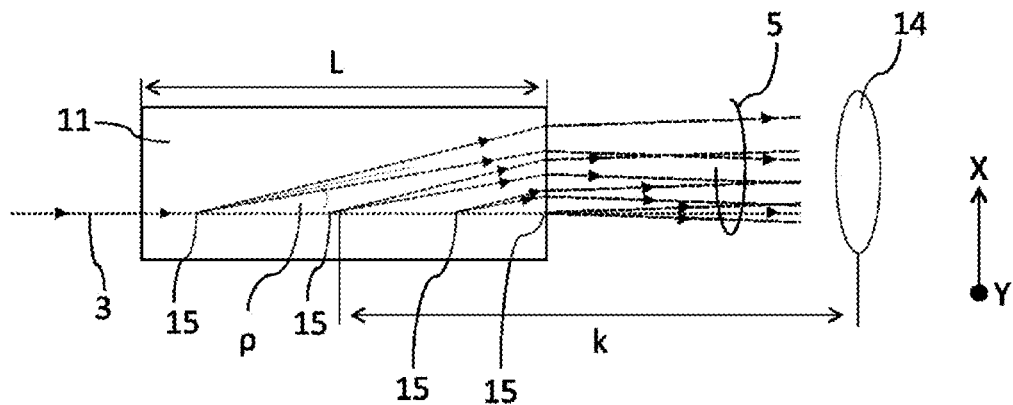
FIG. 8 shows the generation of the converted beam inside the NLFC component, showing birefringent walk-off.

However, the further deterioration of beam quality associated with use of collimating optic 14 with a short focal length is identified and disclosed here for the first time. An explanation of the effect of short focal length collimating optic on the beam quality of the converted beam will now be identified and explained for the first time. Referring to FIG. 8, owing to the walkoff of the converted light, the effective source 15 of the converted light within the NLFC component is distributed over a substantial distance (measured parallel to the direction of the fundamental beam 3 in the NLFC component 11), as illustrated schematically in FIG. 8. A consequence of this distributed source is that a collimating optic with a short focal length is unable to collimate the beam effectively; instead the beam quality of the converted beam 5 is catastrophically degraded by the collimating optic with a short focal length. A collimating optic with a long focal length has reduced sensitivity to this distributed effective source positive (longer depth of focus), and therefore is able to provide a collimated output beam without substantially degrading the beam quality.

Figure 9:
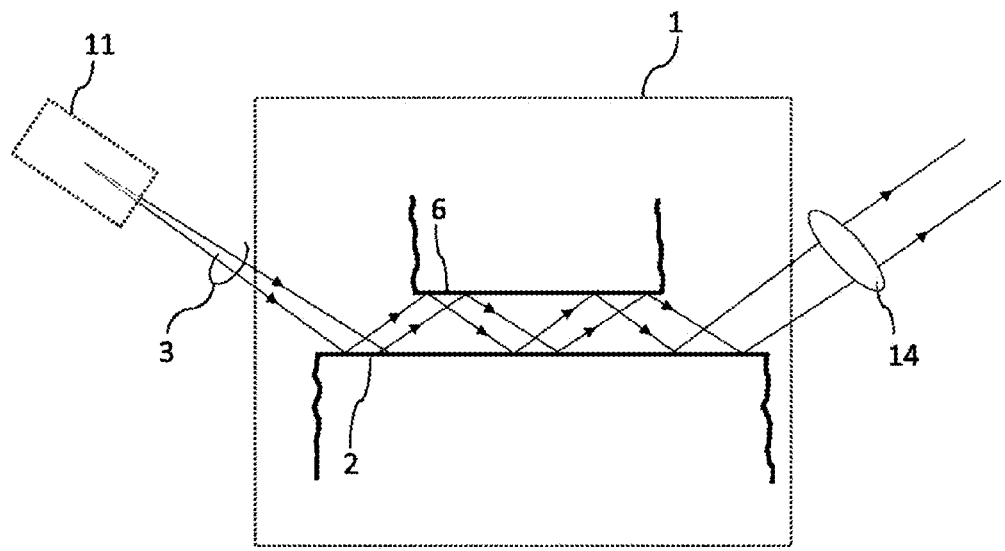
FIG. 9 shows an optic being used after the NLFC component and the wavelength separating element in order to collimate the converted beam.

The advantage of using a collimating optic located a long distance from the NLFC component is incompatible with the need for a compact NLFC device because it necessitates a long optical path between the NLFC component and the collimation optic. The distance from the NLFC component to the collimating optic according to this aspect of the invention provides acceptable beam quality, without causing unacceptable increase in the overall size of the NLFC device. Furthermore, to obtain a compact device, it is advantageous for the wavelength separating element to be disposed on the beam path of the mixed beam 3 between the NLFC component 11 and the collimating optic 14, as illustrated in FIG. 9. Thereby, the fundamental beam incident on the mirror surfaces of the wavelength separating element is non-collimated (i.e. diverging), and presenting a range of angles of incidence not exactly equal to the Brewster angle.

This is in contrast to the example in the prior art by Tangtrongbenchasil et al. [Japanese Journal of Applied Physics 47, p2137 (2008)] wherein the output radiation from a NLFC component is collimated using a concave mirror prior to incidence on a dichroic mirror, in a very bulky NLFC device.

A further advantage of the configuration of the first aspect of the invention is that the total beam path of the fundamental and converted beams through the filter is small and therefore wavelength separating element including at least two reflecting surfaces with at least two reflections from at least one of the surface (and optionally other features described above) may provide high performance filter required for a compact NLFC device, while disposed in the beam path between the NLFC component and the collimating optic.

This invention therefore provides a high performance beam separation in the UV with very high rejection ratios for the fundamental beam and high transmissions for the converted beam in a compact format due to the multi-reflection geometry.

Figure 10:
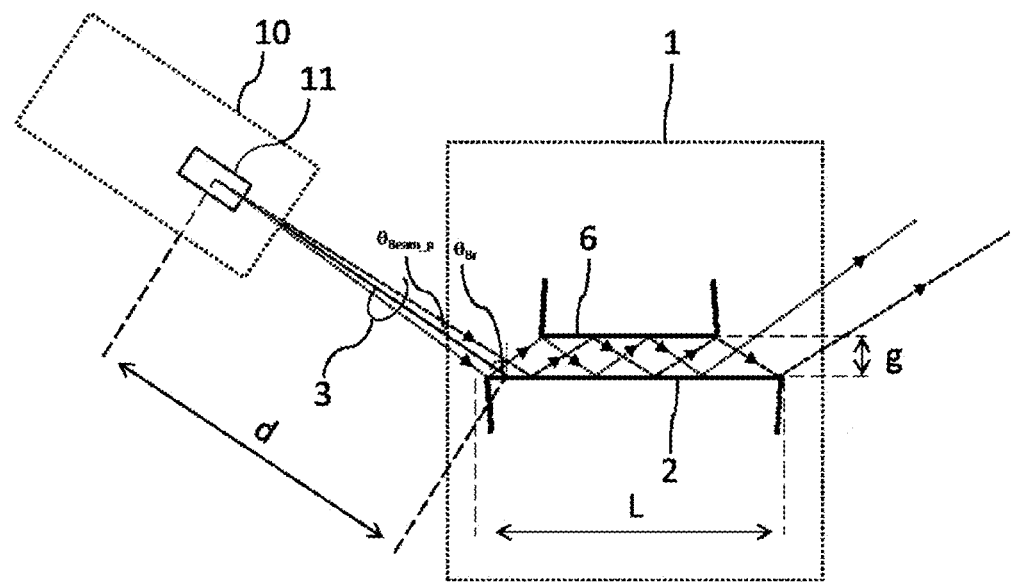
FIG. 10 shows the wavelength separating element consisting of two mirror surfaces and its dimensions.

In another aspect of the invention, suitable dimensions for the wavelength separation element are disclosed. A diverging mixed beam also causes the beam to change in size as it propagates. This puts constraints on the dimensions of the separating element 1 such as gap g between the surfaces 2, 6 and the length L of the element as illustrated in FIG. 10. The mixed beam 3 is emitted from the NLFC component 11, within the NLFC generator 10, with divergent half-angles $\theta_{Beam}$. The divergent half-angle is subdivided into the two orthogonal directions that in the following are described in respect to their relationship to the directions of the p- and s-type polarisations of the incident beam. The dimensions of the wavelength separating element should prevent the beam being clipped at the entrance or the exit of the element. The minimum gap $g_{min}$ for specific $\theta_{Beam\_p}$, $\theta_{Br}$, d and n (number of reflections) can be calculated using:

$$g_{min} = \frac{(\tan(90-\theta_{Br}+\theta_{Beam\_s}) - \tan(90-\theta_{Br}-\theta_{Beam\_s}))*}{\tan(90-\theta_{Br}-\theta_{Beam\_s}) + \tan(90-\theta_{Br}+\theta_{Beam\_s}) +} \quad (4)$$
$$(\tan(90-\theta_{Br}-\theta_{Beam\_s}) - \tan(90-\theta_{Br}+\theta_{Beam\_s}))*(n-1)$$

Figure 11:
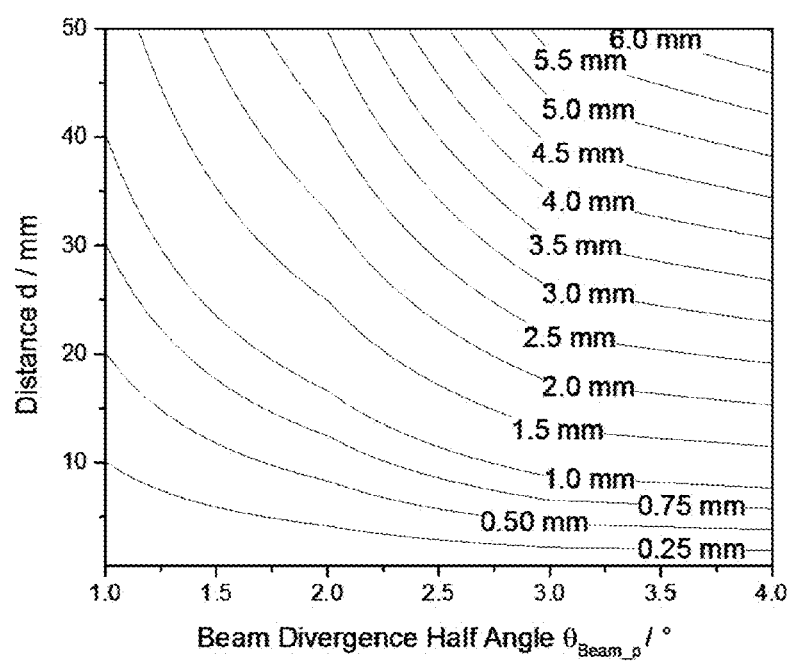
FIG. 11 shows map of the calculated minimum for the gap between the two mirror surfaces.

FIG. 11 shows a map of $g_{min}$ for fixed $\theta_{Br}$=56° and n=5. Using lower values for the gap than $g_{min}$ results in clipping the beam and should be avoided. If this cannot be avoided an additional lens can be used between the component and the separating element thus reducing $\theta_{Br}$ and even converting a diverging beam into a converging one. Once the gap has been chosen the length L can be calculated using:

$$L = \frac{\cos(\theta_{Br})*d + h(n-1)}{\tan(90-\theta_{Br}-\theta_{Beam\_s})} - \frac{\cos(\theta_{Br})*d}{\tan(90-\theta_{Br}+\theta_{Beam\_s})} \quad (5)$$

For example, a beam entering the element from a distance d=10 mm with a divergence half-angle $\theta_{Beam\_p}$=1° at Brewster angle $\theta_{Br}$=56° requires a minimum gap $g_{min}$=0.25 mm for 5 internal reflections. Considering external tolerances, the gap can be set to $g_{min}$=0.4 mm and the length of the separating element will be L=3 mm. The height H of the separating element is determined by the propagation characteristics of the beam in the p-polarised direction and can be calculated using:

$$H = 2*\tan(\theta_{Beam\_s})*\left(d + (n-1)*\frac{g}{\cos(\theta_{Br})}\right) \quad (6)$$

In the case of the above example the height of the element is H=0.45 mm if $\theta_{Beam\_s}$=1°. $\theta_{Beam\_s}$ where H is the direction that is orthogonal to $\theta_{Beam\_p}$ and pointing out-of-plane in FIG. 10. As shown above the multi-reflection geometry allows efficient beam separation in a very compact format.

Figure 12:
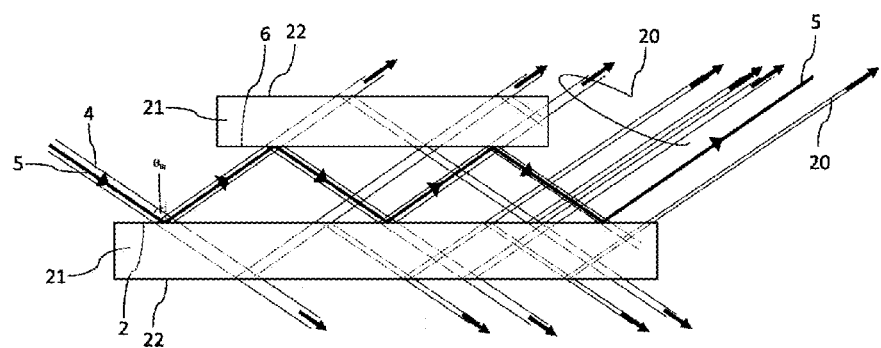
FIG. 12 shows the fundamental beam transmitted through the first and second mirror surface and propagating.

In another aspect of the invention, effective disposal of the fundamental beam 4 which has been transmitted through the first and/or second mirror surfaces is provided. This aspect enables an output converted beam with reduced unwanted light originating from the fundamental beam, while maintaining a compact filter size. The inventors have found that without effective disposal of the fundamental beam 4 after it has passed through the mirror surfaces 2, 6, unacceptable amounts of light from the fundamental beam may be spatially overlapping with the converted beam 5 after propagation through the wavelength separation element. This problem of unwanted fundamental light in the output is particularly acute if the wavelength separation element is configured to be compact, where components are small and closely spaced, as required for a compact NLFC device. The unwanted fundamental light may include separate beams of fundamental light formed due to reflections at surfaces in the wavelength separating element other than the first and second mirror surfaces, which are referred to as non-primary beams 20 (FIG. 12). The unwanted fundamental light may further include diffuse light formed due to scattering of fundamental light within the wavelength separating element.

According to an aspect of the invention, two general approaches may be used to reduce the unwanted fundamental light: removing some or all of the fundamental beam which has passed through a mirror surface; and redirecting some or all of the fundamental beam which has passed through a mirror surface.

In a first example, the wavelength separating element may include at least one plate element having a first surface and a second surface opposite to the first surface, wherein the first surface is one of the first or second mirror surfaces and the second surface is a scattering element that scatters a portion of the fundamental beam that is transmitted through the first or second mirror surface. Alternatively, the second surface may be an absorbing surface That absorbs a portion of the fundamental beam that is transmitted through the first or second mirror surface. With reference to FIG. 12, the first mirror surface 2 is a first surface of a thin plate 21, a second surface 22 of the thin plate 21 is configured to reduce specular reflection from the second surface of any of the fundamental beam transmitted through the first mirror surface 2, which can otherwise lead to non-primary beams. In one example, the second surface 22 is the opposite face of the thin plate 21 to the first mirror surface 2.

Figure 18:
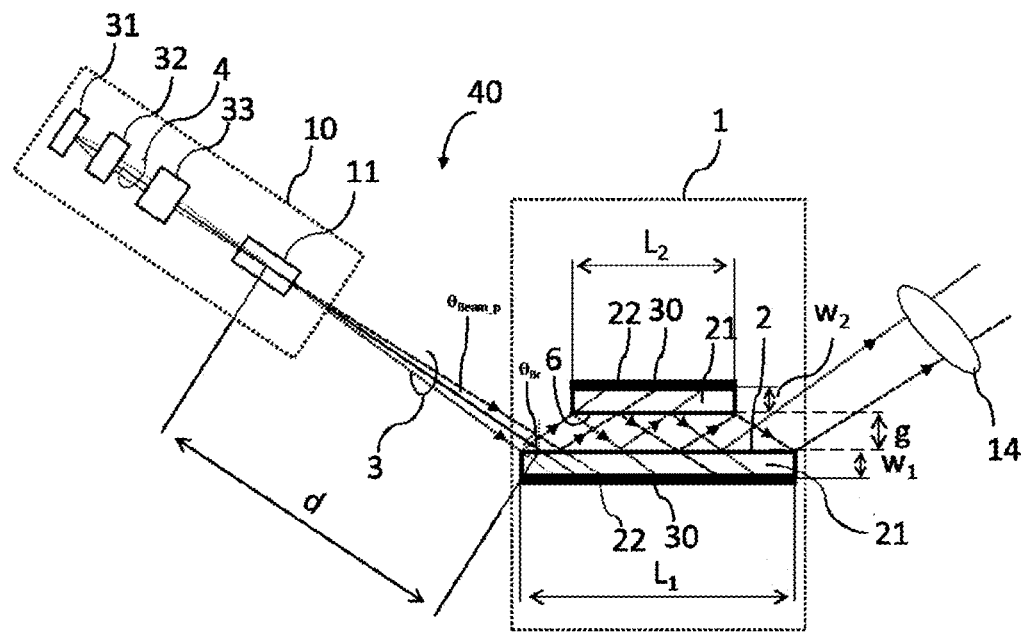
FIG. 18 shows the wavelength separating element including two thin plates being used with a direct frequency-doubling device. The second surfaces of the thin plates include an absorbing layer for the fundamental beam.

The second surface 22 may be configured to be a rough or textured surface which causes scattering of the transmitted fundamental beam which is incident on the second surface. This configuration reduces formation of non-primary beams at the second surface. Configuring the second surface to increase scattering of fundamental light is counterintuitive because it would usually be expected to reduce the overall rejection ratio of the wavelength separation element to fundamental light for two reasons. Firstly, a scattering surface provides much lower transmission to p-type light than a planar surface oriented at the Brewster angle, thereby reducing the amount of fundamental light which is removed from the wavelength separating element altogether. Secondly, a scattering surface increases the contribution of diffuse light (of either s-type or p-type polarisation) which may propagate out of the wavelength separating element (and therefore reduce the performance of the wavelength separating element). Nonetheless, the inventors find that the overall rejection ratio of the wavelength separating element for fundamental light may be significantly improved, and the output of non-primary beams is very substantially reduced, through use of a second surface configured to scatter fundamental light. This can be especially beneficial because non-primary beams may be significant due to the strong reflection of fundamental beams at the second surface 22 caused by the diverging/converging beam (directions not matching the Brewster angle) and/or some s-polarisation within the fundamental beam which is incident on the first mirror surface. In order to promote scattering the surface can be randomly textured and for diffraction type redirection of the fundamental beam the surface can be textured periodically. Alternatively, instead of structuring the surfaces the thin plates can include scattering centres over the whole or partial area of the plate widths $w_1$ or $w_2$ as illustrated in FIG. 18.

The second surface 22 may be configured to be an absorbing surface. For example, one or more absorbing materials may be deposited onto the second surface, or absorbing ions or dopants may be implanted into the thin plate 21, so that the reflection of any fundamental light is reduced (compared with the reflectivity of the bare surface of the thin plate) and/or any of the fundamental light which is incident on the second surface is partially or totally absorbed by the materials.

Figure 13:
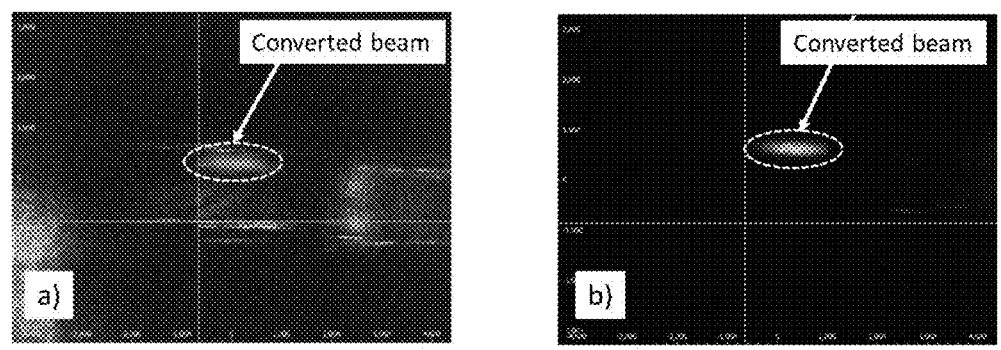
FIG. 13 shows the beam profiles at the exit of the wavelength separating element for 13a) the wavelength separating element with specular second surfaces and 13b) with rough second and absorbing surfaces.

FIG. 13 shows experimental comparison of the advantage of providing roughened second surfaces. A first wavelength separating element was prepared including two thin plates with first mirror surfaces and second mirror surfaces oriented approximately parallel to one another as in FIG. 12. A mixed beam, including a fundamental beam with wavelength 446 nm (originally generated by a laser diode) and a converted beam with wavelength 223 nm generated in a NLFC component including a β-BaB$_2$O$_4$ crystal, was incident on the first mirror surface. No collimating optic acted on the mixed beam between the NLFC component and the first mirror surface; therefore the fundamental and converted beams were divergent when incident on the first mirror surface. The thin plates were UV fused silica and the first and second mirror surfaces were configured with mirror coatings to provide high reflectivity (R>99%) to s-type polarised light with wavelength approximately equal to 223 nm and low reflectivity (R<0.1%) to light with wavelength approximately equal to 446 nm and dominant p-type polarisation; wherein the reflectivities apply for the angle of incidence of the mixed beam on the first mirror surface. The second surfaces 22 of the two thin plates were both optically smooth (specular) surfaces. The image in FIG. 13(a) shows the beam profile taken approximately 20 mm after the exit of the converted beam from the wavelength separating element. The converted beam (223 nm wavelength) is inside the ellipse label; all other intensity in the image is stray light from the fundamental beam passing through the separating element (defined "streaks" in the image) and overall a large diffuse background of light from the fundamental beam (speckles throughout the image). A second wavelength separating element was prepared with the same design as the first wavelength separating element, except that the second surfaces 22 of the two thin plates were configured to be optically rough (diffuse) surfaces (e.g. lapped surfaces) including an absorbing layer (e.g., absorbing dye). The image in FIG. 13(b) shows the beam profile obtained under similar experimental test as for the first wavelength separating element. Again, the converted beam is labelled; in this case, the contribution of stray light from the fundamental beam is greatly reduced. The width and height of FIGS. 13(a) and (b) is 8.8 mm and 6.6 mm respectively.

For the above examples of a second surface configured to reduce the formation of non-primary beams, it is advantageous if an additional filter element 34 (see FIG. 19) is disposed between the NLFC component and the first reflection of the mixed beam from the first mirror surface in the wavelength separating element. This was the case for both examples in FIG. 13. This is particularly important if the ratio of the power of the converted beam divided by the power of the fundamental beam after propagation out of the NLFC component is very low (e.g. less than $10^{-5}$). It is generally the case that this ratio is very low for NLFC device where a laser diode is used to generate the fundamental beam, the NLFC component includes β-BaB$_2$O$_4$ and a SHG process, and the converted beam has a wavelength less than 270 nm. The additional filter element may be used to reduce the power of the fundamental beam in the mixed beam which is incident on the first mirror surface. Without this additional filter element, the very high power of the fundamental beam causes deterioration in performance, either due to very extensive generation of diffusely scattered light in the case that the second surface is configured to be a rough surface, or due to very strong absorption (and therefore local heating of the element which may cause a degradation in performance) in the case that the second surface or the thin plate are configured to be absorbing.

The additional filter element may be a mirror configured to reflect the converted beam with high reflectivity and reflect the transmitted beam with low reflectivity. It is preferable that the reflectivity of the converted beam is more than 50% and most preferably more than 90%. The reflectivity of the transmitted beam is preferably less than 20% and most preferably less than 5%. For example, the additional filter element may be a dichroic Brewster mirror with similar design considerations as for the first mirror surface in the wavelength separating element. The additional filter element may be discrete from the wavelength separating element, or may be integrated together with the wavelength separating element.

This configuration, therefore, of an additional filter element, then a wavelength separating element according to aspects of this invention is particularly effective for a high performance and compact NLFC device.

Figure 24:
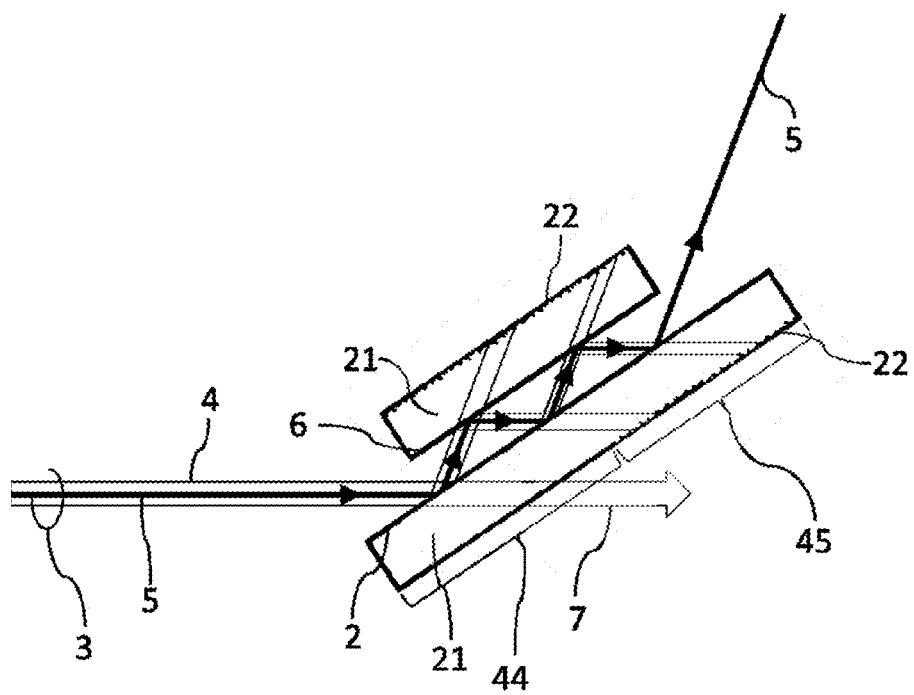
FIG. 24 shows the wavelength separating element including two thin plates with one of the thin plates having a second surface including first and second sections.

As shown in FIG. 24 in particular, it is advantageous especially if no additional filter element is used, if the second surface 22 of the thin plate 21 (that is, the thin plate 21 with a first mirror surface 2) is configured to include a first section 45 and a second section 44 where the first section 45 is configured to be a rough, textured surface and/or absorbing surface and where the second section 44 is configured to be a non-scattering and have small reflection and absorption to the fundamental beam. The second surface 22 is configured so that any of the fundamental beam 4 which is transmitted through the first mirror surface 2 the first time that the fundamental beam is incident on said first mirror surface is incident on the second section 44 of the second surface 22. The second surface 22 is configured so that any of the fundamental beam which is transmitted through the first mirror surface 2 the second (or higher) time that the fundamental beam is incident on said first mirror surface is incident on the first section 45 of the second surface. The fundamental beam transmitted through the first mirror surface 2 at the first incidence on the first mirror surface 2 has more optical power than the fundamental beam transmitted through the first mirror surface at second (or higher) incidence on the first mirror surface 2, so that scattering or absorption of this beam on the second surface 22 leads to a problem such as a large amount of diffusely scattered stray light and/or heating up of the thin plate. Optionally the second surface 44 may include an anti-reflection coating, thereby reducing the power of a non-primary beam.

In another example, the second surface is configured to have reduced reflectivity to fundamental light with s-polarised light than the bare surface (i.e. anti-reflection coating). This is particularly effective to reduce the generation and propagation of non-primary beams with s-type polarisation.

In another example, the second surface is configured to have shape or orientation which reduces the formation of non-primary beams which may be output from the wavelength separating element.

The configuration of the second surface described herein provide effective disposal of the blue light in a highly compact wavelength separating element. A similar configuration of may be used for the second surface 22 of the thin plate 21 for the second mirror surface 6.

Figure 14:
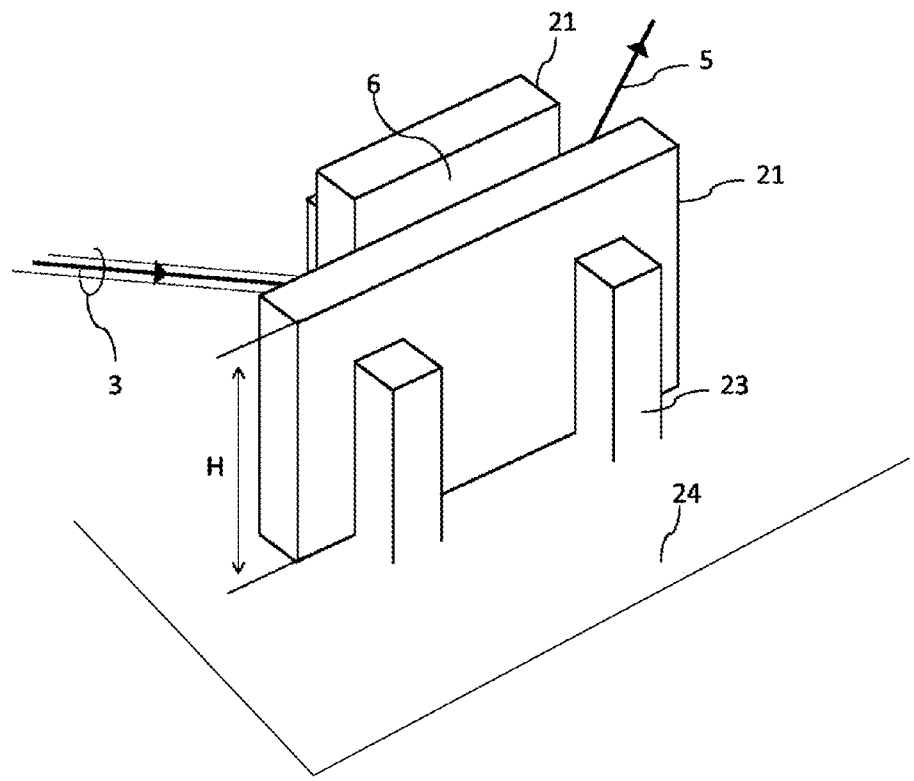
FIG. 14 shows the thin plates being mounted against predefined features of a base.
Figure 15:
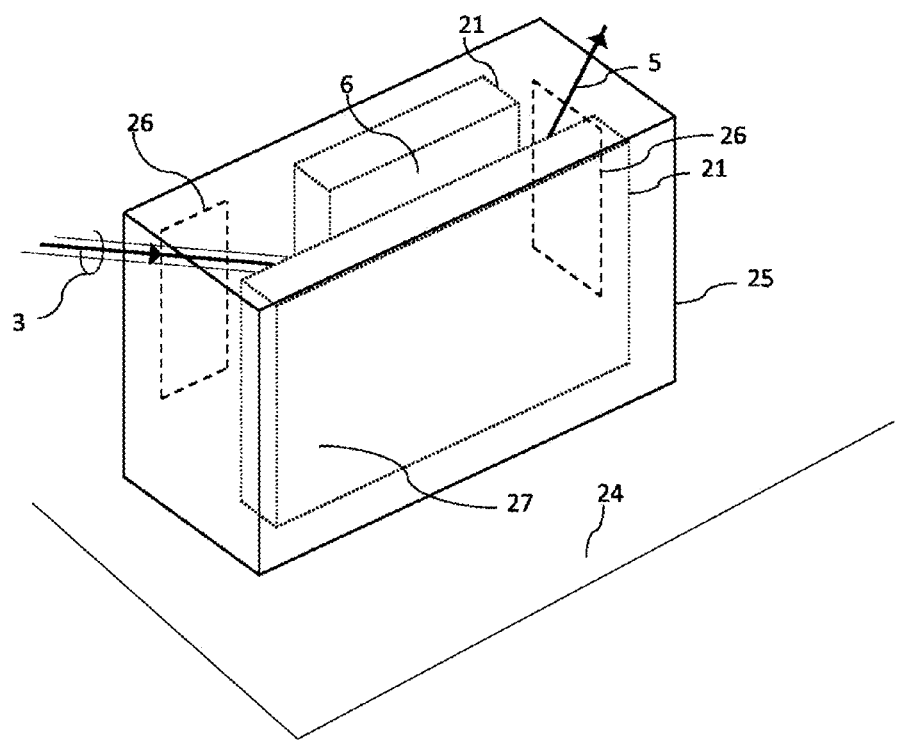
FIG. 15 shows the preassembled holder containing the thin plates.

In another aspect of the invention the wavelength separating element can be directly integrated into the NFLC device, or the wavelength separating element can be first mounted into a holder and this holder can be integrated into the NFLC device. For example, the thin plates 21 could be mounted against predefined features 23 of a base 24 on which other components of the NLFC device are assembled as shown in FIG. 14. The predefined feature can be some type of pins or posts evolving or extending from the base that are fixed in position. The thin plates are then non-actively aligned against those features. Non-active alignment refers to a manufacturing process where the device is in a non-operational mode and the thin plates are purely aligned on fixed positional data. This system provides a compact footprint but lacks flexibility. The inventors have found that the mixed beam 3 emitted from the NLFC generator may have some variations in the beam direction. It is then advantageous to preassemble the thin plates 21 into a holder 25 first (FIG. 15). This preassembly into a holder fixes the position of the thin plates relative to each other. The holder is designed so that the gap between the thin plates is well defined. It is advantageous to use a spacer between the thin slides, where the first and second mirror surfaces 2, 6 are mounted against. This internal spacer, unlike an external spacer mounted against the second surfaces 22 of the thin plates, eliminates any gap thickness uncertainties which can occur if an external spacer is used with thin plates with low thickness tolerances (e.g. an error in parallelism of the plates). The preassembled holder allows correcting for variations in the mixed beam direction by actively aligning the holder relative to the mixed beam direction by translational or rotational means. The internal spacer keeps the relative position of the thin plate fixed during this alignment procedure. The holder can be made or contain transparent, scattering or absorbing materials with the aim of removing the fundamental beam as described in the previous section. The holder includes apertures 26 for the beam entering and exiting. In addition, cut-outs can also be made along the long side 27 of the holder aiming at the removal of the fundamental beam.

The present invention provides advantages over the examples in the prior art. In particular, highly efficient wavelength separation, where the transmission of the converted beam and the rejection ratio of the fundamental beam are high, is possible in a compact format due to a multi-surface reflection geometry. Modifications of certain details of this geometry remove the fundamental beam enabling high rejections ratios of the fundamental beam. This wavelength separating element can be low cost unlike examples in the prior art, because inexpensive materials can be used. This invention is suited for second harmonic generation devices emitting wavelengths below 270 nm and use of a high power laser diode to pump the NLFC component, in particular if the power ratio of converted divided by fundamental beam is low. Several advantages of the present invention have been demonstrated experimentally as described in the detailed description of the invention.

Example 1: NLFC Device with Wavelength Separating Element and Beam Removal Via Absorption In a first example a wavelength separating element 1, shown schematically in FIG. 16, includes a first thin parallel plate 21 with a first mirror surface 2 and a second thin parallel plate 21 with a second mirror surface 6. A mixed beam 3, which includes a spatially overlapping fundamental beam and converted beam, from a NLFC component 11 is incident on the first mirror surface such that the fundamental beam has p-type polarisation and the converted beam has s-type polarisation. The fundamental and converted beams are reflected at the first mirror surface and then undergo further reflections at the second and first mirror surfaces. Some or all of the fundamental beam which is transmitted through the first and second mirror surfaces is absorbed at the second surfaces 22 of the first and second parallel plates 21.

Figure 16:
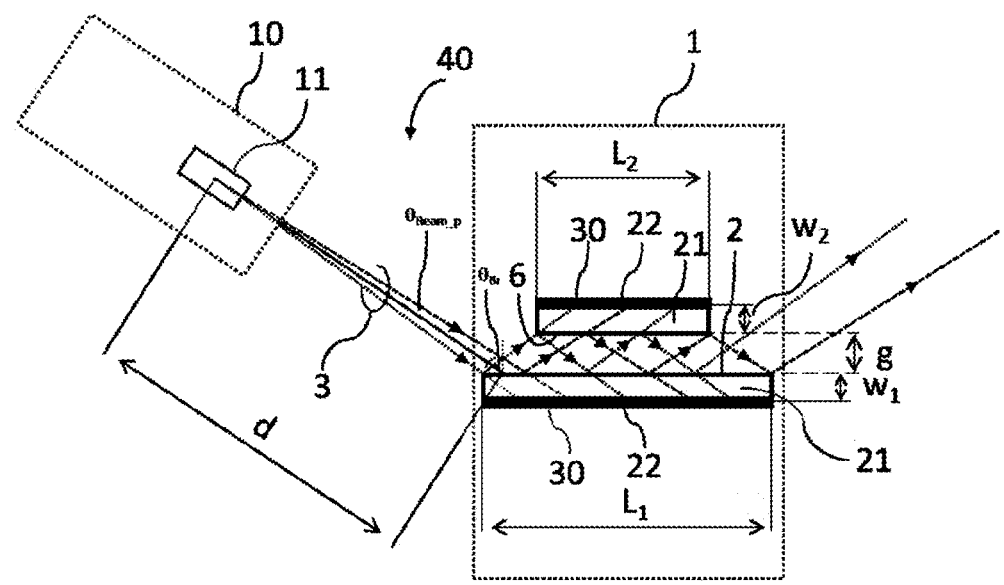
FIG. 16 shows the wavelength separating element including two thin plates being used with a NLFC generator. The second surfaces of the thin plates include an absorbing layer for the fundamental beam.

A schematic diagram of the wavelength separating element is shown in FIG. 16, showing the example where a total of 5 reflections occur from the mirror surfaces. Fewer or more reflections may alternatively be used, depending on the required rejection ratio $A_f$ of the fundamental beam, or other constraints. It is preferable to use between 3 and 10 reflections in total. The parallel plates 21 include a material that supports Brewster type reflections for p-type polarised fundamental beam at a surface of the plates with approximate Brewster angle according to equation 2. Preferably the parallel plates 21 include the same material. In the current example the parallel plates are both UV fused silica but other suitable materials for inclusion in the parallel plates include silica, borosilicate (e.g. BK7), silicon, PMMA, fluoropolymers, and other plastics. The first and second mirror coatings are configured to provide reflectivity for the s-polarised converted beam greater than 50% and preferably greater than 99%, reflectivity for the p-polarised fundamental beam less than 1% and preferably less than 0.1%, and reflectivity for s-polarised fundamental beam less than 20% and preferably less than 10%. In this example the first and second mirror surfaces include stacked multilayer coatings including materials including lanthanum fluoride ($LaF_3$) and magnesium fluoride ($MgF_2$), but other suitable materials may be used in addition or instead of these. In another variation different coatings are deposited on the first and second mirror surfaces. This can be advantageous, as for example the second mirror surface may be configured to provide a lower reflectivity for s-polarised fundamental beam than the first mirror coating, and thereby provide a higher rejection ratio for the component of the fundamental beam with s-type polarisation.

Absorbing layers 30 are on the second surfaces 22 of the first and second parallel plates 21. The absorbing layers absorb some or all of the light from the fundamental beam which has been transmitted through the first or second mirror surfaces 2, 6. In this example the absorbing layers are some form of absorbing ink, pigment, dye or paint deposited onto the second surfaces of the parallel plates. Alternatively, the absorbing layers can be made of thin films of other materials or separate plates that are attached to the second surfaces of the plates 21. In another variation of the fundamental beam removal via absorption, the plates 21 can be made partially or fully absorbing by using absorbing material (e.g. Silicon) or implantation of ions or dopants among other methods. In another variation, an absorptive material is placed at a distance from the second surfaces to absorb the transmitted beam, and optionally an anti-reflection coating is deposited on the second surface back of the plates, reducing reflection of the fundamental light, thereby promoting transmission of the fundamental light.

The dimensions of the plates 21 and the gap (g) between the plates may be chosen according to the divergence half-angle $\theta_{Beam}$ in s- and p-polarisation directions at which the fundamental and converted beams are propagating, and the distance k (measured along the propagation direction of the fundamental beam) between the effective source of the fundamental beam (i.e. the position from which the fundamental beam appears to diverge) and the first reflection at the first mirror surface. The effective source may be located near to the centre of the NLFC component 11, but can be virtually displaced by the use of an optical component (e.g. lens) between the component and the separating element. The divergence half-angles of the fundamental and the converted beams can vary so that the widest angle is considered for calculations. The half-angles $\theta_{Beam\_p}$ are in the range between 0.1° and 10° and preferably between 0.5° and 3°. The mixed beam 3 can be either converging or diverging or collimated. The distance d is in the range between 1 mm and 500 mm and preferably between 1 mm and 50 mm. The gap g is in the range between 0.1 mm and 20 mm and preferably between 0.2 mm and 6 mm. The gap may preferably be slightly greater than in respect to the calculated value $g_{min}$ because of variances the beam characteristics and alignment tolerances. The length $L_1$ is then in the range between 2 mm and 100 mm and preferably between 2 mm and 20 mm. If an even number of total reflections is required then $L_2$ is equal to $L_1$. If an odd number of total reflections is required then $L_2$ is in the range between 1 mm and 70 mm and preferably between 1 mm and 15 mm. It is preferable to use only two parallel plates 21 where at least two reflections occur at at least one of the parallel plates. However, in a variation, separate parallel plates may be configured to provide each of the reflections (i.e. there is only one reflection from each parallel plates). It is advantageous to use at least two reflection from at least one of the plates because the beam incident on the mirror surfaces covers a large area of the mirror surfaces and even a small gap between the plates introduces losses of transmission efficiency of the converted beam while propagating through the separating element. In term of performance it is preferable to use large thicknesses $w_1$, $w_2$ for the plates so that the non-primary beams generated by reflection of the transmitted beam at the second surfaces 22 do not overlap with the output converted beam. However, large thicknesses are less economical. Thin plates, on the other hand, are economical but tend to be less rigid and can flex. Therefore the thicknesses $w_1$, $w_2$ are in the range between 0.4 mm and 10 mm and preferably between 0.4 mm and 2 mm. The height H of the plates (measured along a direction perpendicular to the plane of the diagram in FIG. 14) is determined by the half-angles $\theta_{Beam_s}$ in the s-polarised direction and is in the range between range between 0.1 mm and 20 mm and preferably between 1 mm and 10 mm.

The plates 21 are mounted into a holder fixing the gap between the plates. This holder is then disposed onto a base (on which other components of the NLFC device 40 are disposed) with appropriate alignment to receive the input mixed beam and provide an output converted beam. In another variation the plates 21 may be directly mounted onto the base.

The wavelength separating element is orientated so that the central ray of the input mixed beam 3 is incident at an angle close to $\theta_{Br}$ on the first mirror surface 2 (within 5°; preferably within 0.5°. The converted beam is reflected off the first mirror surface 2 and the majority of the fundamental beam is being transmitted through the mirror surface, and some or all of the transmitted beam is absorbed by the absorbing layer on the second surface 22. Any of the fundamental beam which is reflected at the first mirror surface propagates onwards together with the converted beam, the majority of which is reflected at the first mirror surface. Similar reflections, transmissions and absorptions repeat at the second mirror surface and then again at the first mirror surface and repeat until the mixed beam exits the wavelength separating element as an output converted beam.

This invention can be used alone or in combination with other separating elements including the ones presented in the prior art. This depends on the desired overall device design and the desired properties of the useable converted beam among others. It should also be anticipated that other optical elements may be inserted into the beam path between the NLFC component 11 and the wavelength separating component in order to condition the fundamental or converted beam before it enters the separating element.

Example 2: NLFC Device with Separating Element and Beam Removal Via Scattering

The second example is similar to the first example and common features may not be repeated. Components which have the same, or similar function to those in previous examples are labelled with common numerical labels in the figures. In the second example, which is illustrated in FIG. 17, the disposal of the fundamental beam which has been transmitted through the first and second mirror surfaces 2, 6 is provided by configuring the second surfaces 22 of the first and second plates 21, to be textured so that the fundamental light is diffusely scattered at the second surfaces.

Figure 17:
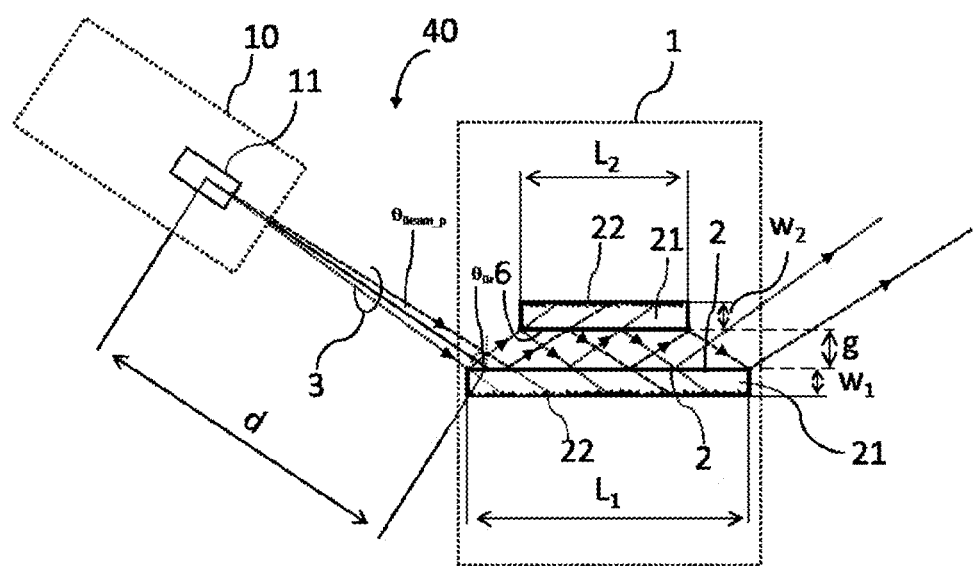
FIG. 17 shows the wavelength separating element including two thin plates being used with a NLFC generator. The second surfaces of the thin plates are textured promoting scattering of the fundamental beam.

As illustrated in FIG. 17 the second surfaces 22 of the plates 21 are textured to promote scattering. The fundamental beam transmitted through the mirror surfaces 2, 6 is scattered at the textured second surfaces 22 of the plates. Scattering eliminates specular directional reflection of the fundamental beam off the second surfaces, which may otherwise lead to overlap with the output converted beam and reduce the rejection ratio of the wavelength converting element. Any textured surface which reduces specular reflection of the transmitted fundamental beam is suitable. For this example the plates 21 were UV fused silica, and the second surfaces were mechanically ground to a randomly textured surface which provided diffuse reflection. The second surfaces can be randomly textured with features sizes larger than wavelength of the fundamental beam. Variations of the scattering source include the use of a fully or partially diffuse plates and the use of a separate textured piece which is attached to the back surfaces using via index-matching among others.

It should also be noted that both removal methods, absorption and redirection, can be used in combination. For example, the plates can first be randomly textured and then an absorptive layer deposited on top of the back surfaces.

Example 3: Direct Frequency-Doubling Device with Separating Element and Beam Removal The third example is similar to the first example and common features may not be repeated. Components which have the same, or similar function to those in previous examples are labelled with common numerical labels in the figures. In this third example, which is illustrated in FIG. 18, deep ultraviolet light in the wavelength range 200 nm-270 nm is generated by frequency-doubling of light emitted by a solid-state light emitter which is a semiconductor laser such as a laser diode 31. The fundamental beam emitted from the laser diode 31 includes wavelength in the range between 400 nm and 540 nm. In this example the laser diode includes $Al_yGa_xIn_zN$ materials with an emission wavelength of approximately 440 nm.

The fundamental beam emitted from the laser diode 31 is incident on a NLFC component 11. Optionally the fundamental beam 4 propagates through one or more optical elements prior to being incident on the NLFC component 11 where the optical elements modify the properties of the fundamental beam, for example so that it converges to a waist within the NLFC component. In this example the fundamental beam propagates through a collimating lens 32 which reduces a divergence angle of the beam emitted by the laser diode, and the fundamental beam then propagates through an optical system 33 including one or more lenses which focus the fundamental beam so that it is converging as it propagates towards the NLFC component, and then forms a waist (i.e. a radius of the fundamental beam reaches a minimum value) within the NLFC component, and then the fundamental beam diverges as it propagates further through the NLFC component, and continues to diverge when it has propagated out of the NLFC component.

The optical system 33 is configured so that the convergence angle of the fundamental beam in at least one plane of the fundamental beam causes SHG of a converted beam in the NLFC component with good efficiency. In this example the NLFC component is a component of $\beta$-$BaB_2O_4$ which is oriented for phase matched type I SHG of light with wavelength of the fundamental beam (i.e. approximately 440 nm wavelength), and the converted beam has a wavelength of approximately 220 nm. The converted beam 5 may undergo birefringent walkoff within the NLFC component; for example in the case of a fundamental beam of wavelength 440 nm, and $\beta$-$BaB_2O_4$, the walkoff angle is approximately 4°.

Two planes of the fundamental beam are herein defined as the "s-polarised plane" and the "p-polarised plane". The s-polarised plane is the plane which contains the direction of propagation of the fundamental beam and the direction of electric field oscillation which is subsequently s-polarised at the reflection with the first mirror surface 2. The p-polarised plane is the plane which contains the direction of propagation of the fundamental beam and the direction of electric field oscillations which is subsequently p-polarised at the reflection with the first mirror surface 2.

The convergence half angle of the fundamental beam incident on the NLFC component is in the range between 0.1° and 15° in s-polarised plane and in the p-polarised plane and preferably between 0.5° and 3° in both planes. The fundamental beam preferably forms a waist within the NLFC component in both planes of the beam and then, after propagating out of the NLFC component, diverges with divergence half angles in the s-polarised and p-polarised similar to the as the convergence half angles in the respective planes when it was incident on the NLFC component.

A converted beam is generated by SHG within the NLFC component. The mixed beam 3 includes the diverging fundamental beam and the converted beam, which may be spatially overlapping one another.

Figure 19:
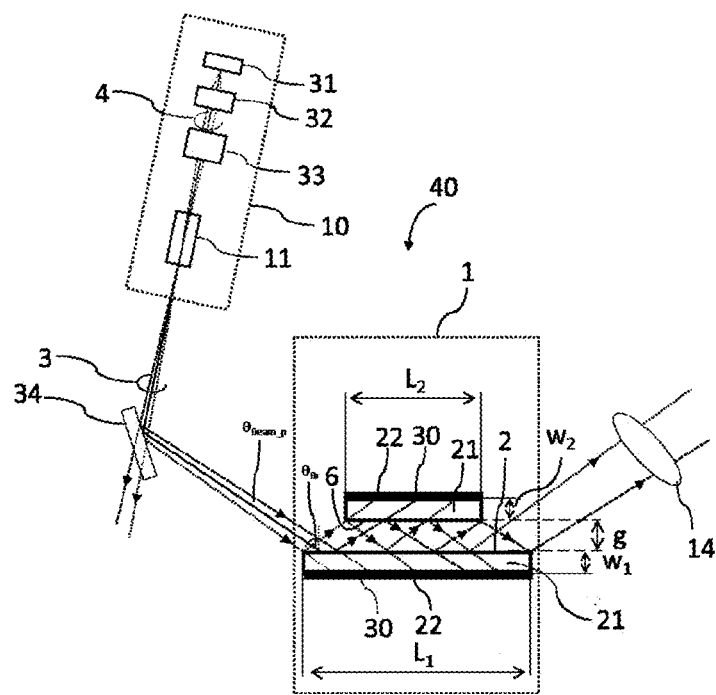
FIG. 19 shows the wavelength separating element including two thin plates being used with a direct frequency-doubling generator and an additional filter element. The second surfaces of the thin plates include an absorbing layer for the fundamental beam.

Optionally, the mixed beam is incident on an additional filter element 34, which has high reflectivity for the converted beam 5 and a low reflectivity for the fundamental beam 4, as illustrated in FIG. 19. The reflected mixed beam 3 is then incident on the first mirror surface of a wavelength separating element 1. Alternatively, the mixed beam 3 is incident on the first mirror surface of a wavelength separating element 1 without reflecting from the additional filter element 34.

A wavelength separating element 1 includes a first and second plate 21. The mixed beam 3 is incident on a first mirror surface 2 of the first plate. The dominant polarisation of the fundamental beam is p-type at the incidence with the first mirror surface. The dominant polarisation of the converted beam is s-type at the incidence with the first mirror surface.

The first mirror surface 2 includes a multilayer of $MgF_2$ and $LaF_3$ materials and the first plate is UV fused silica. The angle of incidence of the fundamental beam at the first mirror surface is approximately equal to the Brewster angle) (≈56°). The first mirror surface is configured to provide a high reflectivity of approximately 99% for the s-polarisation of the converted beam. The first mirror surface provides a low reflectivity of approximately 0.1% for the p-polarised component of the fundamental beam and a reflectivity of approximately 20% for the s-polarised component of the fundamental beam. The fundamental and converted beams reflected from the first mirror surface 2 are incident on the second mirror surface 2 of the second plate 21. The second mirror surface is approximately parallel to the first mirror surface (that is, the angle between the first and second mirror surfaces is less than 2°. The second mirror surface is configured to have similar reflectivity to the fundamental and converted beams (i.e. the multilayer coating may be the same as for the first mirror surface, and the material of the second plate may be the same as the first plate). As for previous examples, the fundamental and converted beams are reflected from the first mirror surface a total of three times, and from the second mirror surface a total of two times. Transmitted fundamental beams 4 are absorbed by an absorbing material 30 which is disposed on the second surfaces 22 of the first and second plates 21. An example of a suitable material is absorbing ink, pigment, dye or paint. Other organic or inorganic materials may be used as alternatives. The second surfaces 22 may also optionally be textured (either with or without the absorbing material disposed on them) to provide scattering of the transmitted fundamental beams.

The dimensions of the first and second plates may be configured according to the result of equation 4, 5 and 6.

After propagation through the wavelength separating element, the output converted beam may be collimated using a collimating optic 14. Optionally a collimating optic may be disposed in the beam path between the NLFC component and the wavelength separation element. However, it is preferred that the collimating optic 14 acts on the output converted beam since this enables use of a collimating optic a relatively long distance from the NLFC component (thereby ensuring good beam quality of the output converted light) while also enabling a highly compact NLFC device 40.

The performance of wavelength separating elements according to this example were measured experimentally for NLFC devices with fundamental wavelength approximately 440 nm and converted wavelength approximately 220 nm. In a first device including an additional filter element 34 in the path of the mixed beam between the NLFC component and the first mirror surface, the wavelength separating element exhibited a rejection ratio for the fundamental beam of at least $5 \times 10^3$, and the transmission efficiency of converted beam was at least 98%. In a second device in which the mixed beam was incident on the first mirror surface without reflection from a dichroic mirror, the rejection ratio for the fundamental beam was at least $1 \times 10^5$, and the transmission efficiency of converted beam was at least 98%. The high rejection ratio and high transmission ratio is suitable for NLFC devices according the current example, for which the ratio of power in the converted beam divided by the power in the fundamental beam may be in the range $10^{-5}$-$10^{-3}$.

The overall size of the NLFC device 40 according to the current example may be small. For example, a NLFC device 40 according to the current example, which provided an output converted beam with wavelength ≈220 nm was demonstrated with a packaged footprint smaller than 25 $cm^2$, with the wavelength separating element occupying an area in the footprint of less than 1 $cm^2$. The wavelength separating element according to the current invention enables such a small NLFC device, while also providing very high rejection ratio of the fundamental beam and high transmission efficiency of the converted beam.

Figure 20:
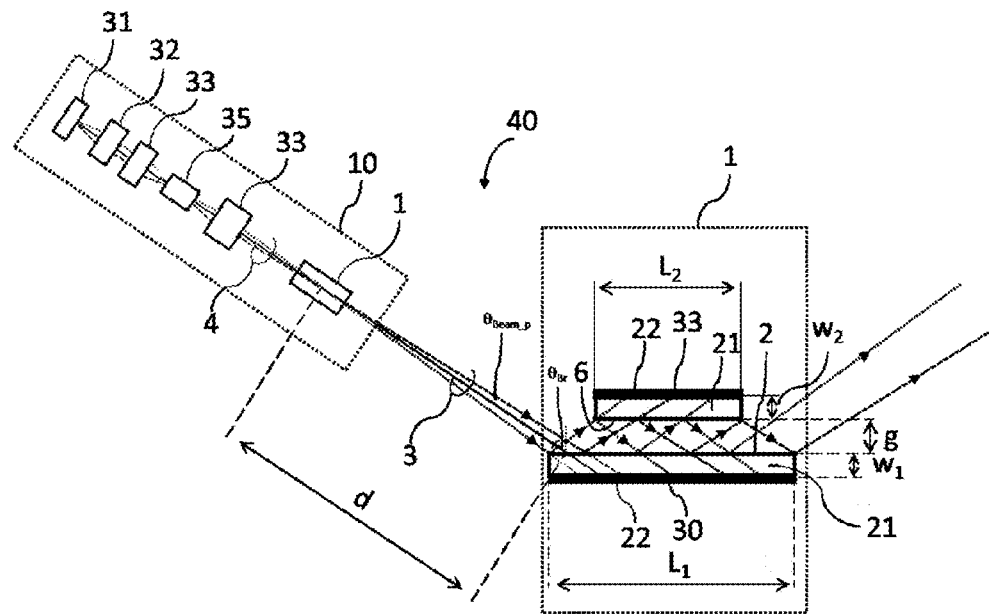
FIG. 20 shows the wavelength separating element including two thin plates being used with an indirect frequency-doubling generator. The second surfaces of the thin plates include an absorbing layer for the fundamental beam.

Example 4: Indirect Frequency-Doubling Device with Separating Element and Beam Removal The fourth example is similar to the first and third example and common features may not be repeated. In this third example, which is illustrated in FIG. 20, deep ultraviolet light in the wavelength range 200 nm-270 nm is generated by frequency-doubling of longer wavelength light emitted by a solid-state light emitter which is pumped by light emitted from a laser diode among others.

The beam emitted from the laser diode 31 is first collimated by a collimating optics 32 consisting of one or more optical components and then focused into a resonator 35 containing the gain medium. The fundamental beam emitted from the resonator is in the wavelength range between 400 nm and 540 nm, and propagates through the NLFC component 11 generating the converted beam with wavelength in the range between 200 nm and 270 nm. Optionally, the fundamental beam emitted from the resonator is focussed by an optional optical system 33 so that it is converging as it propagates towards the NLFC component 11. In this example the optical system 33 was used. The strength of focusing of the optical system 33 is determined by the focal length of the optical components within the optical system 33 and can be expressed in terms of convergence angle. The convergence angle in s-polarised plane and p-polarised plane is in the range between 0.1° and 10° and preferably between 0.5° and 3°. The mixed beam 3 exiting the NLFC component propagates at similar angles to those of the input beam of the component and is incident on the first mirror surface 2 of the separating element at an angle of incidence close to $\theta_{Br}$. As the mixed beam propagates through the separating element the fundamental beam is removed via absorption. It should be noted that removal via redirection or a combination of both is applicable as well as described in example 2. The NLFC device 40 can also contain additional optical components with additional functions such as wavelength stabilisation, optical enhancement using a resonator among others.

Figure 21:
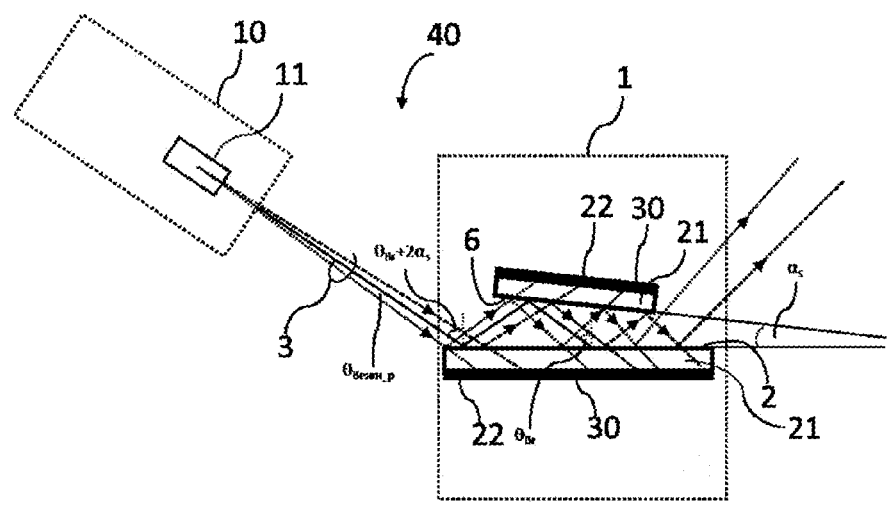
FIG. 21 shows the wavelength separating element including two thin plates being used with a NLFC generator. The thin plates are tilted in respect to each other.

Example 5: NLFC Device with Separating Element Using Small Angle Orientated Surfaces The fifth example is similar to the first example and common features may not be repeated. Components which have the same, or similar function to those in previous examples are labelled with common numerical labels in the figures. In this example a wavelength separating element 1 includes a first plate 21 with a first mirror surface 2 and a second plate 21 with a second mirror surface 6, and the first and second mirror surfaces are not parallel to one another. The angle between the surface normal of the first and second surfaces is $\alpha_s$. Preferably the surface normals of the first and second mirror surfaces lie in the same geometrical plane, where said plane also contains the propagation direction of the fundamental beam which is incident on the first mirror surface 2. An exemplary configuration is illustrated in FIG. 21.

The advantage of using an angle $\alpha_s$ is twofold. Firstly the effect of a divergence of the fundamental beam 4 on the rejection ratio can be reduced, and secondly tolerances in the angle of incidence of the mixed beam 3 component incident on the first mirror surface may be relaxed. In a system consisting of plates with an angle $\alpha_s$, the angle of incidence changes for successive reflections on the first and second mirror surfaces 2, 6. If the mixed beam 3 is incident at Brewster angle $\theta_{Br}$ on the first reflection, then the angle of incidence reduces by $\alpha_s$ for each successive reflection. In the case of a separating element using 5 reflections the system can be configured so that the angle of incidence on the $3^{rd}$ reflection is Brewster angle $\theta_{Br}$. In this way the angle of incidence for the beam varies either side of the Brewster angle $\theta_{Br}$ as the beam propagates. The choice of $\alpha_s$ depends on the preferred range of angle of incidence and is in the range of 0.01° to 10°. The range of angles of incidence over all reflections (the "angular range") is preferably approximately equal to the beam divergence full-angle $2*\theta_{Beam\_p}$ or close to the angular tolerances for the direction of the mixed beam 3 exiting the component NLFC component 11. If the angular range is 4° than the tilt between the two plates is $\alpha_s=4°/(n-1)=1°$ and the angle of incidence at the first mirror surface is $\theta_{Br}+2\alpha_s$. The angle of incidence at the first mirror surface can be calculated using $\theta_{Br}+2\alpha_s$ only if the opening between the two plates faces towards the first mirror reflection, in other words, the gap between the plates decreases as the beam propagates as illustrated in FIG. 21. If the opening is towards the exit (the gap increases as the beam propagates) then the angel of incidence at the first mirror surface can be calculated using $\theta_{Br}-2\alpha_s$. The opening determines whether the angular scanning of the angle of incidence will be from lower to higher values and vice versa. In other variations the mirror surfaces 2, 6 and the back surface 22 of a plate 21 can be non-parallel. The fundamental beam passing through the mirror surfaces 2, 6 is removed by an absorbing layer on the back surfaces, but other variation as also possible as described in the earlier examples.

Example 6: NLFC Device with Internal Reflecting Separating Element

Figure 22:
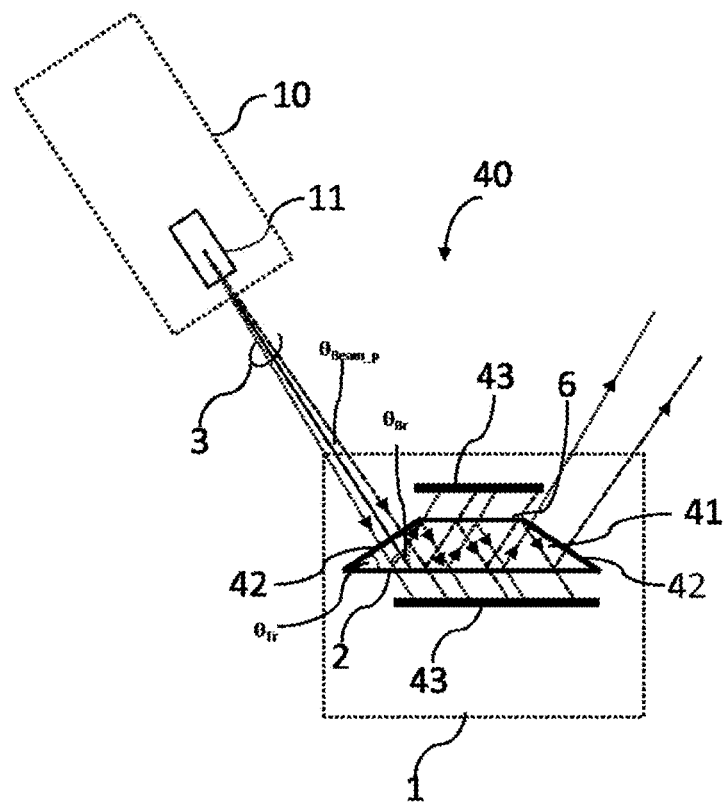
FIG. 22 shows the wavelength separating element including a single piece element. The mixed beam is propagating through the internal volume of the element. Two absorbing layers are placed at the outer sides of the element removing the fundamental beam.

This example illustrates a wavelength separating element 1 including a single internal element 41 and the mixed beam 3 propagates through the internal volume of said element as shown in FIG. 22.

The separating element 1 includes a material which does not strongly absorb the converted beam (e.g. absorption of the converted beam by the material is less than 50% for propagation through the element), and optionally does not strongly absorb the fundamental beam. The separating element includes a first mirror surface 2 and a second mirror surface 6, for example with multilayer coatings as in previous examples. These coatings are configured so that the s-polarised converted beam experiences high reflectivity greater than 50% and preferably greater than 99%. The mixed beam 3 is incident on the first mirror surface at Brewster angle $\theta_{Br}$, where it is noted that in this case the fundamental beam is propagating in a medium with refractive index greater than air (i.e. the refractive index of the material in the separating element 1). For example, if the material has a refractive index of n=1.5 and the medium on the opposite side of the first mirror surface is air n≈1.0 then $\theta_{Br}\approx33°$. The angle $\theta_{Tr}$ of the side surface 42 of the internal element, and the angle of incidence of the fundamental beam at the side surface 42 are chosen appropriately. For example, a trapezoid as illustrated in FIG. 22 may be used. There can also be coatings deposited on the side surface 42 with high transmission for the converted beam, where transmission is greater than 50% and preferably greater than 99%. The majority of the fundamental beam is not reflected at the first mirror surface, and the majority of the converted beam (preferably at least 99%) is reflected. An advantage of using lower angles of incidence than in previous examples is that the separating element may be shorter because the beams reflect at a steeper angle. Another advantage of this configuration relates to the coupling of a diverging beam into a medium with higher refractive index because the beam divergence angle $\theta_{Beam}$ is reduced as the beam enters. This narrowing of the beam divergence allows use of a smaller separation between the first and second mirror surfaces 2, 6. The transmitted part of the fundamental beam propagates outside the separating element and it is preferable to remove this beam by absorption or redirection. It is preferable to use absorbing element 43 at a distance between 0.2 mm and 10 mm to the mirror surfaces for absorbing portions of the fundamental beam that are transmitted through the mirror surfaces. It should also be noted that a redirection method can be used to remove the beam from the separating element. Non-parallel first and second mirror surfaces may be used, as in example 5.

Figure 23:
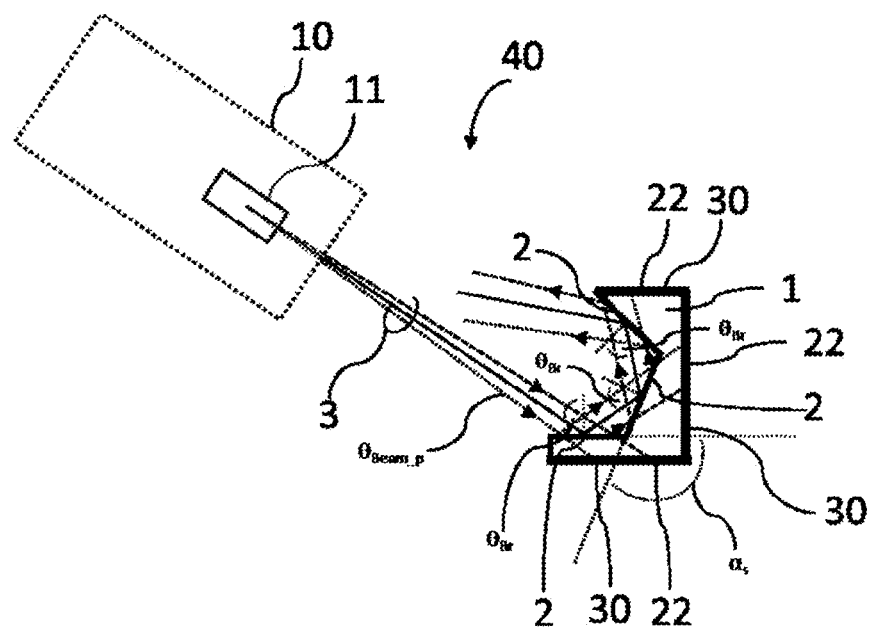
FIG. 23 shows the wavelength separating element including a single piece element. The mirror surfaces are oriented at large angles in respect to each other. The back surfaces of the single piece include absorbing layers for the removal of the fundamental beam.

Example 7: NLFC Device with Separating Element Using Large Angle Orientated Surfaces This example illustrates a wavelength separating element 1 including a single element in which the angles between the first, second and third mirror surfaces are large, as shown in FIG. 23. This example is similar to the first example and common features may not be repeated.

First, second and third mirror surfaces 2 are configured to have reflective properties similar to the first and second mirror surfaces in previous examples. The mirror surfaces are configured to maintain a preferred angle of incidence for the fundamental beam for low reflection of the fundamental beam (e.g. Brewster angle) at each reflection. The mixed beam is incident on the first mirror surface, reflected to the second mirror surface, and then reflected to the third mirror surface, at which a further reflection occurs. This example illustrates 3 reflections but fewer or more mirror surfaces and more reflections can also be used and the separating element is configured accordingly. In order to satisfy the Brewster angle at each reflection, the mirror surfaces 2 may be configured so that the angle between them is $\alpha_s=2\theta_{Br}$. The separating element 1 can be made of transparent or absorptive material for the fundamental beam. There are multilayer coating deposited on the mirror surfaces 2 with high reflectivities for the s-polarised converted beam. These coatings have reflectivities greater than 50% and preferably greater than 99%. The mixed beam 3 is incident on the first mirror surface at approximately the Brewster angle and the converted beam is reflected while most of the fundamental beam is being transmitted through the mirror surface. There are absorbing layers 30 deposited on the back surfaces 22. The part of the fundamental beam that passes through the mirror surfaces is absorbed by the absorbing layer 30 on the back surfaces 22. In other variations, the back surfaces can also be textured in order to redirect the fundamental beam as described in example 1. In another variation of this separating element the single piece can also be split up into individual piece. In another variation of this separating element the beams are coupled into a solid block and guided which the block as shown in example 6. In another variation the straight mirror surfaces 2 are replaced by a common of individual curved surfaces.

An aspect of the invention, therefore, is a wavelength separating element for separating a second beam from a first beam in a nonlinear frequency conversion (NLFC device) wherein the second beam has a wavelength different from a wavelength of the first beam. In exemplary embodiments, the wavelength separating element includes a first mirror surface, and a second mirror surface opposite to the first mirror surface. The first and second mirror surfaces have a high reflectivity of the second beam relative to a reflectivity of the first beam, and the first and second mirror surfaces are configured such that the first and second beams undergo multiple reflections between the first mirror surface and the second mirror surface to separate the second beam from the first beam. The first and second mirror surfaces are configured such that the first and second beams undergo at least three reflections at the first and second mirror surfaces. The wavelength separating element may include one or more of the following features, either individually or in combination.

In an exemplary embodiment of the wavelength separating element, the first and second mirror surfaces have a reflectivity of the second beam of at least 50%, and a reflectivity of the first beam of a maximum of 10%.

In an exemplary embodiment of the wavelength separating element, the first and second mirror surfaces are configured such that the first and second beams undergo at least two reflections at one of the first mirror surface or the second mirror surface.

In an exemplary embodiment of the wavelength separating element, the first and second mirror surfaces are disposed on separate elements spaced apart such that the first and second beams propagate through a spatial gap between the mirror surfaces.

In an exemplary embodiment of the wavelength separating element, the first and second mirror surfaces are disposed on a single element such that the first and second beams propagate within an internal volume of the single element between the mirror surfaces.

In an exemplary embodiment of the wavelength separating element, a gap "g" between the mirror surfaces and a length "L" of the wavelength separating element is determined based on a divergent half angle of a mixed beam including the first and second beams.

In an exemplary embodiment of the wavelength separating element, the wavelength separating element further includes at least one plate element having a first surface and a second surface opposite to the first surface, wherein the first surface is one of the first or second mirror surfaces and the second surface includes a scattering element that scatters a portion of the first beam that is transmitted through the first or second mirror surface.

In an exemplary embodiment of the wavelength separating element, there are two thin plates each including a first surface respectively comprising the first mirror surface and the second mirror surface, and a second surface includes the scattering element.

In an exemplary embodiment of the wavelength separating element, the wavelength separating element further includes at least one plate element having a first surface and a second surface opposite to the first surface, wherein the first surface is one of the first or second mirror surfaces and the second surface includes an absorbing element that absorbs a portion of the first beam that is transmitted through the first or second mirror surface.

In an exemplary embodiment of the wavelength separating element, there are two thin plates each including a first surface respectively comprising the first mirror surface and the second mirror surface, and a second surface comprising the absorbing element.

In an exemplary embodiment of the wavelength separating element, the wavelength separating element further includes a holder configured for mounting the at least one thin plate within the holder.

In an exemplary embodiment of the wavelength separating element, the holder comprises a base and a predefined structure extending perpendicularly from the base, and the at least one thin plate is mounted on the base and against the predefined structure.

In an exemplary embodiment of the wavelength separating element, the wavelength separating element further includes first and second absorbing elements respectively in proximity to the first and second mirror surfaces, and that absorb a portion of the first beam that is transmitted through the first and second mirror surfaces.

In an exemplary embodiment of the wavelength separating element, the first mirror surface and the second mirror surface are non-parallel to each other.

Another aspect of the invention is a nonlinear frequency conversion (NLFC) device. In exemplary embodiments, the NLFC device includes a laser light source configured to generate a first beam comprising a fundamental beam, an NLFC component configured to generate a second beam comprising a converted beam that is generated by converting a portion of the fundamental beam into the converted beam; and the wavelength separating element of any of embodiments, wherein the first beam is the fundamental beam and the second beam is the converted beam. The NLFC device may include one or more of the following features, either individually or in combination.

In an exemplary embodiment of the NLFC device, the NLFC device further includes an output collimating optic configured to collimate an output converted beam that is outputted from the wavelength separating element, such that the wavelength separating element is disposed on a propagation path of the second beam between the NLFC component and the output collimating optic.

In an exemplary embodiment of the NLFC device, the collimating optic is a distance from the centre of the NLFC component, measured along the propagation path of the second beam, greater than the length of the NLFC component divided by 0.5.

In an exemplary embodiment of the NLFC device, the NLFC component is configured to generate the converted beam by frequency doubling a portion of the fundamental beam, wherein the converted beam has a wavelength equal to half the wavelength of the input beam and the converted beam is a deep ultraviolet light beam.

In an exemplary embodiment of the NLFC device, the NLFC device further includes a laser diode configured to generate the fundamental beam.

In an exemplary embodiment of the NLFC device, the NLFC device further includes a filter element positioned between the NLFC component and the wavelength separating element, wherein the filter element has a high reflectivity of the converted beam relative to a reflectivity of the fundamental beam.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

Wavelength separating elements in accordance with the present invention may be used in light sources using NLFC, for example ultraviolet light sources. Said light sources may be used as the light source in fluorescence sensors or absorption sensors.

What is claimed is:

1. A wavelength separating element for separating a second beam from a first beam in a nonlinear frequency conversion (NLFC device) wherein the second beam has a wavelength different from a wavelength of the first beam, the wavelength separating element comprising:
    a first mirror surface; and
    a second mirror surface opposite to the first mirror surface; wherein:
    the first and second mirror surfaces have a high reflectivity of the second beam relative to a reflectivity of the first beam, and the first and second mirror surfaces are configured such that the first and second beams undergo multiple reflections between the first mirror surface and the second mirror surface to separate the second beam from the first beam;
    wherein the first and second mirror surfaces are configured such that the first and second beams undergo at least three reflections at the first and second mirror surfaces; and
    wherein the first and second mirror surfaces have a reflectivity of the second beam of at least 50%, and a reflectivity of the first beam of a maximum of 10%.

2. The wavelength separating element of claim 1, wherein the first and second mirror surfaces are configured such that the first and second beams undergo at least two reflections at one of the first mirror surface or the second mirror surface.

3. The wavelength separating element of claim 1, wherein the first and second mirror surfaces are disposed on separate elements spaced apart such that the first and second beams propagate through a spatial gap between the mirror surfaces.

4. The wavelength separating element of claim 1, wherein the first and second mirror surfaces are disposed on a single element such that the first and second beams propagate within an internal volume of the single element between the mirror surfaces.

5. The wavelength separating element of claim 1, wherein a gap "g" between the mirror surfaces and a length "L" of the wavelength separating element is determined based on a divergent half angle of a mixed beam including the first and second beams.

6. The wavelength separating element of claim 1, further comprising at least one plate element having a first surface and a second surface opposite to the first surface, wherein the first surface is one of the first or second mirror surfaces and the second surface includes a scattering element that scatters a portion of the first beam that is transmitted through the first or second mirror surface.

7. The wavelength separating element of claim 6, comprising two thin plates each including a first surface respectively comprising the first mirror surface and the second mirror surface, and a second surface includes the scattering element.

8. The wavelength separating element of claim 6, further comprising a holder configured for mounting the at least one thin plate within the holder.

9. The wavelength separating element of 8, wherein the holder comprises a base and a predefined structure extending perpendicularly from the base, and the at least one thin plate is mounted on the base and against the predefined structure.

10. The wavelength separating element of claim 1, further comprising at least one plate element having a first surface and a second surface opposite to the first surface, wherein the first surface is one of the first or second mirror surfaces and the second surface includes an absorbing element that absorbs a portion of the first beam that is transmitted through the first or second mirror surface.

11. The wavelength separating element of claim 10, comprising two thin plates each including a first surface respectively comprising the first mirror surface and the second mirror surface, and a second surface comprising the absorbing element.

12. The wavelength separating element of claim 1, further comprising first and second absorbing elements respectively in proximity to the first and second mirror surfaces, and that absorb a portion of the first beam that is transmitted through the first and second mirror surfaces.

13. The wavelength separating element of claim 1, wherein the first mirror surface and the second mirror surface are non-parallel to each other.

14. A nonlinear frequency conversion (NLFC) device comprising:
a laser light source configured to generate a first beam comprising a fundamental beam; and
an NLFC component configured to generate a second beam comprising a converted beam that is generated by converting a portion of the fundamental beam into the converted beam; and the wavelength separating element of claim 1, wherein the first beam is the fundamental beam and the second beam is the converted beam.

15. The NLFC device of claim 14, further comprising an output collimating optic configured to collimate an output converted beam that is outputted from the wavelength separating element, such that the wavelength separating element is disposed on a propagation path of the second beam between the NLFC component and the output collimating optic.

16. The NLFC device of claim 15, wherein the collimating optic is a distance from the centre of the NLFC component, measured along the propagation path of the second beam, greater than the length of the NLFC component divided by 0.5.

17. The NLFC device of claim 14, wherein the NLFC component is configured to generate the converted beam by frequency doubling a portion of the fundamental beam, wherein the converted beam has a wavelength equal to half the wavelength of the input beam and the converted beam is a deep ultraviolet light beam.

18. The NLFC device of claim 17, further comprising a laser diode configured to generate the fundamental beam.

19. The NLFC device of claim 14, further comprising a filter element positioned between the NLFC component and the wavelength separating element, wherein the filter element has a high reflectivity of the converted beam relative to a reflectivity of the fundamental beam.

20. A nonlinear frequency conversion (NLFC) device comprising:
a laser light source configured to generate a first beam comprising a fundamental beam; and
an NLFC component configured to generate a second beam comprising a converted beam that is generated by converting a portion of the fundamental beam into the converted beam, wherein the second beam has a wavelength different from a wavelength of the first beam; and a wavelength separating element configured to separate the second beam from the first beam;
wherein the wavelength separating element comprises:
a first mirror surface; and
a second mirror surface opposite to the first mirror surface; wherein:
the first and second mirror surfaces have a high reflectivity of the second beam relative to a reflectivity of the first beam, and the first and second mirror surfaces are configured such that the first and second beams undergo multiple reflections between the first mirror surface and the second mirror surface to separate the second beam from the first beam;
wherein the first and second mirror surfaces are configured such that the first and second beams undergo at least three reflections at the first and second mirror surfaces.

* * * * *